United States Patent
Tian et al.

(10) Patent No.: US 10,819,134 B2
(45) Date of Patent: Oct. 27, 2020

(54) ADAPTER AND METHOD FOR CHARGING CONTROL

(71) Applicant: Guangdong Oppo Mobile Telecommunications Corp., Ltd., Dongguan, Guangdong (CN)

(72) Inventors: Chen Tian, Guangdong (CN); Jialiang Zhang, Guangdong (CN)

(73) Assignee: GUANGDONG OPPO MOBILE TELECOMMUNCATIONS CORP., LTD., Dongguan (CN)

(*) Notice: Subject to any disclaimer, the term of this patent is extended or adjusted under 35 U.S.C. 154(b) by 498 days.

(21) Appl. No.: 15/811,770

(22) Filed: Nov. 14, 2017

(65) Prior Publication Data

US 2018/0069409 A1    Mar. 8, 2018

Related U.S. Application Data

(63) Continuation of application No. PCT/CN2017/070523, filed on Jan. 7, 2017.

(30) Foreign Application Priority Data

Feb. 5, 2016 (WO) ................. PCT/CN2016/073679
Jul. 26, 2016 (CN) ........................... 2016 1 0600612

(51) Int. Cl.
*H02J 7/02* (2016.01)
*G01R 31/3842* (2019.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
CPC .. H02J 7/027; H02J 7/00712; H02J 7/007188; H02J 7/00714; H02J 7/02;
(Continued)

(56) References Cited

U.S. PATENT DOCUMENTS 3,974,660 A    8/1976  Farr
4,087,733 A    5/1978  Casagrande
(Continued)

FOREIGN PATENT DOCUMENTS

CN    1897394 A     1/2007
CN    101924471 A   12/2010
(Continued)

OTHER PUBLICATIONS

CN-203981764; specification, figures, abstract (Year: 2014).*
(Continued)

*Primary Examiner* — Dharti H Patel

(57) ABSTRACT

An adapter for charging control include a power converting unit, a sample and hold unit, a current acquisition and control unit. The power converting unit is configured to convert an input AC to obtain an output voltage and an output current of the adapter, and the output current of the adapter is a current of a first pulsating waveform. The sample and hold unit is connected to the power converting unit, and is configured to sample the current of the first pulsating waveform when the sample and hold unit is in a sampling state and hold a peak value of the current of the first pulsating waveform when the sample and hold unit is in a holding state. The current acquisition and control unit is configured to determine whether the sample and hold unit is in the holding state.

25 Claims, 15 Drawing Sheets

(51) Int. Cl.

| | | |
|---|---|---|
| *H02M 3/335* | (2006.01) | |
| *H02J 7/00* | (2006.01) | |
| *H02J 7/04* | (2006.01) | |
| *H02M 7/217* | (2006.01) | |
| *H02J 7/06* | (2006.01) | |
| *H02M 1/08* | (2006.01) | |
| *H02M 7/06* | (2006.01) | |
| *H01M 10/0525* | (2010.01) | |
| *H01M 10/42* | (2006.01) | |
| *H01M 10/44* | (2006.01) | |
| *H02M 1/44* | (2007.01) | |
| *H02M 5/04* | (2006.01) | |
| *H02M 7/04* | (2006.01) | |
| *H02J 7/24* | (2006.01) | |
| *H02M 1/00* | (2006.01) | |
| *H02J 7/10* | (2006.01) | |

(52) U.S. Cl.
CPC ......... *H01M 10/425* (2013.01); *H01M 10/44* (2013.01); *H02J 7/00* (2013.01); *H02J 7/007* (2013.01); *H02J 7/008* (2013.01); *H02J 7/0029* (2013.01); *H02J 7/0031* (2013.01); *H02J 7/0071* (2020.01); *H02J 7/00711* (2020.01); *H02J 7/00712* (2020.01); *H02J 7/00714* (2020.01); *H02J 7/007188* (2020.01); *H02J 7/007192* (2020.01); *H02J 7/02* (2013.01); *H02J 7/022* (2013.01); *H02J 7/04* (2013.01); *H02J 7/045* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 10/4257* (2013.01); *H01M 2010/4271* (2013.01); *H02J 7/00034* (2020.01); *H02J 7/00036* (2020.01); *H02J 7/0042* (2013.01); *H02J 7/00043* (2020.01); *H02J 7/0047* (2013.01); *H02J 7/0049* (2020.01); *H02J 7/00304* (2020.01); *H02J 7/2434* (2020.01); *H02J 2007/10* (2013.01); *H02J 2207/10* (2020.01); *H02J 2207/20* (2020.01); *H02M 2001/0009* (2013.01)

(58) Field of Classification Search
CPC ........ H02J 7/00; H02J 7/0071; H02J 7/00711; H02J 7/007192; H02J 7/0031; H02J 7/04; H02J 7/007; H02J 7/045; H02J 2207/10; H02J 7/00034; H02J 7/00304; H02J 2207/20; H02J 2007/10; H02J 7/0045; H02J 7/0022; H02J 7/0027; H02J 7/0042; H02J 7/1492; H02J 7/0049; H02J 7/2434; H02J 7/0044; H02J 7/0072; H02J 7/00043; H02J 7/00036; H02J 7/0047; H02J 7/085; H02J 7/087; H02J 7/0077; H02J 7/0029; H02J 7/008; H02J 7/022; H02J 7/06; G01R 31/3842; G01R 31/3835; G01R 31/66; G01R 15/144; G01R 29/12; G01R 19/2506; G01R 19/04; G01R 19/2509; H02M 3/33523; H02M 3/335; H02M 3/33507; H02M 2001/0009; H02M 3/156; H02M 3/33515; H02M 3/33546; H02M 2001/0048; H02M 1/44; H02M 5/04; H02M 7/04; H02M 7/06; H02M 2001/0003; H02M 2001/0064; H02M 3/33569; H02M 3/33576; H02M 7/217; H02M 1/08; H02M 3/33592; H01M 10/4257; H01M 2010/4271; H01M 10/443; H01M 10/0525; H01M 10/425; H01M 10/44; H02H 3/202; H02H 7/18; H01F 27/425; H01F 2027/408; H03M 1/66
USPC ........................................................ 320/139
See application file for complete search history.

(56) References Cited

U.S. PATENT DOCUMENTS

| | | | |
|---|---|---|---|
| 4,354,148 A | 10/1982 | Tada et al. | |
| 4,608,499 A | 8/1986 | Rathmann | |
| 4,763,045 A | 8/1988 | Choi et al. | |
| 5,214,369 A | 5/1993 | McCrea | |
| 5,442,274 A | 8/1995 | Tamai | |
| 5,563,487 A | 10/1996 | Davis | |
| 5,614,802 A | 3/1997 | Nilssen | |
| 5,633,577 A | 5/1997 | Matsumae et al. | |
| 6,025,695 A | 2/2000 | Friel et al. | |
| 6,075,340 A * | 6/2000 | Koenck ........... | H02J 7/0091 320/112 |
| 6,137,265 A | 10/2000 | Cummings et al. | |
| 6,297,616 B1 | 10/2001 | Kubo et al. | |
| 6,414,465 B1 | 7/2002 | Banks et al. | |
| 6,803,746 B2 | 10/2004 | Aker et al. | |
| 6,909,617 B1 | 6/2005 | Mirskiy | |
| 7,999,517 B2 | 8/2011 | Arai et al. | |
| 9,263,968 B2 | 2/2016 | Potts et al. | |
| 2002/0000758 A1 | 1/2002 | Song et al. | |
| 2002/0119364 A1 | 8/2002 | Bushong et al. | |
| 2004/0090209 A1 | 5/2004 | Nishida et al. | |
| 2004/0097275 A1 | 5/2004 | Ohno et al. | |
| 2004/0257833 A1 | 12/2004 | Yang et al. | |
| 2005/0017681 A1 | 1/2005 | Ogishima et al. | |
| 2005/0253557 A1 | 11/2005 | Yao | |
| 2006/0284595 A1 | 12/2006 | Hsieh et al. | |
| 2007/0096696 A1 | 5/2007 | Lefley et al. | |
| 2007/0181547 A1 | 8/2007 | Vogel et al. | |
| 2008/0149320 A1 | 6/2008 | Nilsson et al. | |
| 2008/0197811 A1 | 8/2008 | Hartular et al. | |
| 2008/0231236 A1 | 9/2008 | Watanabe et al. | |
| 2009/0097283 A1 | 4/2009 | Krein | |
| 2009/0257259 A1 | 10/2009 | Leibovitz | |
| 2010/0060081 A1 | 3/2010 | Cheong et al. | |
| 2010/0202159 A1 | 8/2010 | Sims et al. | |
| 2010/0231174 A1 | 9/2010 | Li et al. | |
| 2011/0101910 A1 | 5/2011 | Li et al. | |
| 2011/0140673 A1 | 6/2011 | Zhang et al. | |
| 2011/0241610 A1 | 10/2011 | Watanabe et al. | |
| 2011/0241611 A1 | 10/2011 | Watanabe et al. | |
| 2012/0086393 A1 | 4/2012 | Gray et al. | |
| 2012/0098495 A1 | 4/2012 | Yang et al. | |
| 2012/0201102 A1 | 8/2012 | Fischer | |
| 2013/0141034 A1 | 6/2013 | Huang et al. | |
| 2014/0103863 A1 | 4/2014 | Fassnacht et al. | |
| 2014/0159641 A1 | 6/2014 | Geren | |
| 2014/0197780 A1 | 7/2014 | Imamura et al. | |
| 2014/0300321 A1 | 10/2014 | Kim et al. | |
| 2014/0320086 A1 | 10/2014 | Wallis | |
| 2014/0327306 A1 | 11/2014 | Inoue | |
| 2015/0084581 A1 | 3/2015 | Nakano et al. | |
| 2015/0102766 A1 | 4/2015 | Trnka | |
| 2015/0180356 A1 | 6/2015 | Norisada et al. | |
| 2015/0263638 A1 | 9/2015 | Yang | |
| 2016/0164321 A1 | 6/2016 | Kuan | |
| 2016/0172877 A1 | 6/2016 | Xue et al. | |
| 2016/0204654 A1 | 7/2016 | Mondal et al. | |
| 2016/0221455 A1 | 8/2016 | Ando et al. | |
| 2016/0344200 A1 | 11/2016 | Zhang et al. | |
| 2017/0168516 A1 | 6/2017 | King | |
| 2017/0187200 A1 | 6/2017 | Somerville et al. | |
| 2018/0069409 A1 | 3/2018 | Tian et al. | |

(56) References Cited

U.S. PATENT DOCUMENTS

| | | | |
|---|---|---|---|
| 2018/0090977 A1 | 3/2018 | Zhang et al. |
| 2018/0214971 A1 | 8/2018 | Ihde |
| 2018/0331560 A1 | 11/2018 | Tian et al. |

FOREIGN PATENT DOCUMENTS

| | | |
|---|---|---|
| CN | 202026118 U | 11/2011 |
| CN | 102545360 A | 7/2012 |
| CN | 102801340 A | 11/2012 |
| CN | 102916595 A | 2/2013 |
| CN | 103001272 A | 3/2013 |
| CN | 102364856 B | 10/2013 |
| CN | 101938154 B | 11/2013 |
| CN | 103580506 A | 2/2014 |
| CN | 103762702 A | 4/2014 |
| CN | 103795040 A | 5/2014 |
| CN | 203747451 U | 7/2014 |
| CN | 203981764 U | 12/2014 |
| CN | 104810877 A | 7/2015 |
| CN | 104810879 A | 7/2015 |
| CN | 104917271 A | 9/2015 |
| CN | 104967199 A | 10/2015 |
| CN | 104967201 A | 10/2015 |
| CN | 105098900 A | 11/2015 |
| CN | 105472827 A | 4/2016 |
| CN | 106026327 A | 10/2016 |
| CN | 106100083 A | 11/2016 |
| CN | 106253428 A | 12/2016 |
| CN | 205882810 U | 1/2017 |
| CN | 205883072 U | 1/2017 |
| EP | 2887492 A2 | 6/2015 |
| EP | 2930589 A1 | 10/2015 |
| EP | 2980958 A1 | 2/2016 |
| JP | S61244267 A | 10/1986 |
| JP | S63184073 A | 7/1988 |
| JP | S63187321 A | 8/1988 |
| JP | H01091626 A | 4/1989 |
| JP | H01197998 A | 8/1989 |
| JP | H03189569 A | 8/1991 |
| JP | H04138506 A | 5/1992 |
| JP | 06046535 A | 2/1994 |
| JP | H06165407 A | 6/1994 |
| JP | H06351170 A | 12/1994 |
| JP | 05103430 A | 4/1999 |
| JP | 2000275282 A | 10/2000 |
| JP | 2002027758 A | 1/2002 |
| JP | 2002044878 A | 2/2002 |
| JP | 2002152988 A | 5/2002 |
| JP | 2002262565 A | 9/2002 |
| JP | 2009060716 A | 3/2009 |
| JP | 2010011563 A | 1/2010 |
| JP | 2010093965 A | 4/2010 |
| JP | 2011205839 A | 10/2011 |
| JP | 2012223077 A | 11/2012 |
| JP | 2012249409 A | 12/2012 |
| JP | 2013031303 A | 2/2013 |
| JP | 2013093952 A | 5/2013 |
| JP | 2013-198262 A | 9/2013 |
| JP | 5454781 B2 | 3/2014 |
| JP | 2014161146 A | 9/2014 |
| JP | 2014220876 A | 11/2014 |
| JP | 3198222 U | 6/2015 |
| JP | 5822304 B2 | 11/2015 |
| JP | 2016063622 A | 4/2016 |
| JP | 2017506053 A | 2/2017 |
| JP | 2017506055 A | 2/2017 |
| JP | 2017507636 A | 3/2017 |
| JP | 2018518132 A | 7/2018 |
| JP | 2018519775 A | 7/2018 |
| TW | 200616305 A | 5/2006 |
| TW | 200910041 A | 3/2009 |
| TW | 201117518 A | 5/2011 |
| TW | M481439 U | 7/2014 |
| TW | 201524105 A | 6/2015 |
| TW | 201601433 A | 1/2016 |
| WO | 2012167677 A1 | 12/2012 |
| WO | 2013114497 A1 | 8/2013 |
| WO | 2014012518 A1 | 1/2014 |
| WO | 2015113341 A1 | 8/2015 |
| WO | 2015113349 A1 | 8/2015 |

OTHER PUBLICATIONS

Extended European search report issued in corresponding European application No. 17746704.0 dated Apr. 23, 2018.
Liang-Rui Chen, 'A Design of an Optimal Battery Pulse Charge System by Frequency-Varied Technique', IEEE Transactions on Industrial Electronics, vol. 54, No. 1, Feb. 2007, pp. 398-405.
First Examination Report issued in corresponding IN application No. 201717041237 dated Oct. 23, 2019.
Second Written Opinion issued in corresponding Singapore application No. 11201801422U dated Sep. 18, 2019.
Extended European search report issued in corresponding European application No. 17746705.7 dated Jul. 30, 2018.
International search report issued in corresponding international application No. PCT/CN20171070524 dated Jul. 28, 2017.
Notice of Preliminary Rejection issued in corresponding KR application No. 10-2017-7033644 dated Feb. 18, 2020.
Office Action 1 issued in corresponding India application No. 201737041040 dated Sep. 4, 2019.

* cited by examiner

ADAPTER AND METHOD FOR CHARGING CONTROL

CROSS-REFERENCE TO RELATED APPLICATION

This application is a continuation of International Application No. PCT/CN2017/070523, filed on Jan. 7, 2017, which claims priority to International Application No. PCT/CN2016/073679, filed on Feb. 5, 2016, and Chinese Application No. 201610600612.3, filed on Jul. 26, 2016, the contents of all of which are herein incorporated by reference in their entireties.

TECHNICAL FIELD

The present disclosure relates to the field of charging, and particularly to an adapter and a method for charging control.

BACKGROUND

An adapter, also known as a power adapter, is used to charge a device to be charged, such as a terminal. Currently the adapter on the market generally uses a constant voltage to charge the device to be charged (such as the terminal). As a battery of the device to be charged is generally a lithium battery, the use of constant voltage for charging is likely to cause lithium precipitation phenomenon, resulting in shorter battery life.

BRIEF DESCRIPTION OF THE DRAWINGS

In order to more clearly illustrate the technical solution of the implementations of the present disclosure, the following drawings, which are to be used in the implementations, will be briefly described. It will be apparent that the drawings described below are merely some implementations, those skilled in the art will be able to obtain additional drawings in accordance with these drawings without paying creative work.

DETAILED DESCRIPTION

Figure 1:
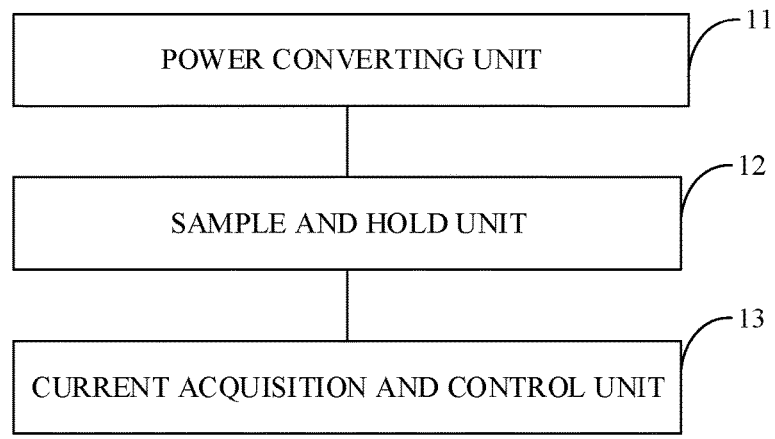
FIG. 1 is a schematic structure diagram illustrating a second adapter according to an implementation.

Implementations of the present disclosure will now be described in conjunction with the accompanying drawings, and it will be apparent that the described implementations are part of the present disclosure and are not intended to be exhaustive. All other implementations obtained by one of ordinary skill in the art without creative work are intended to be within the scope of the present disclosure, based on the implementations provided herein.

A first adapter for charging a device to be charged (e.g., a terminal) is mentioned in the related art. The first adapter typically operates in a constant-voltage mode. In the constant-voltage mode, an output voltage of the first adapter basically maintains constant, such as 5V, 9V, 12V, 20V, and so on.

The output voltage of the first adapter is not suitable to be directly applied to both ends of a battery. The output voltage of the first adapter needs to be regulated by a conversion circuit built in the device to be charged (e.g., a terminal) in order to obtain a charging voltage and/or a charging current desired by the battery of the device to be charged (such as a terminal).

The conversion circuit is configured to convert the output voltage of the first adapter to the charging voltage and/or the charging current desired by the battery.

As an example, the conversion circuit may refer to a charging management module such as a charging integrated circuit (IC) configured to regulate the charging voltage and/or the charging current for the battery during the battery charging process. The conversion circuit may serve the function of a voltage feedback module and that of a current feedback module thus realizing management of the charging voltage and/or the charging current of the battery.

For example, the battery charging process may include one or more of the following stage: a trickle charging stage, a constant-current charging stage, and a constant-voltage charging stage. In the trickle charging stage, the conversion circuit can make the current flowing into the battery in the trickle charging stage by using a current feedback loop reach the magnitude of the battery desired charging current (such as a first charging current). In the constant-current charging stage, the conversion circuit may use a current feedback loop to make the current flowing into the battery in the constant-current charging stage meet the battery desired charging current (such as a second charging current which may be greater than the first charging current). In the constant-voltage charging stage, the conversion circuit may use a voltage feedback loop to make the voltage applied to both ends of the battery in the constant-voltage charging stage meet the battery desired charging voltage.

As an example, when the output voltage of the first adapter is greater than the battery desired charging voltage, the conversion circuit can be configured to perform a step-down conversion on the output voltage of the first adapter so that the stepped-down charging voltage would be able to meet requirements of the battery desired charging voltage. As another example, when the output voltage of the first adapter is lower than the battery desired charging voltage, the conversion circuit can be configured to perform a step-up conversion on the output voltage of the first adapter so that the stepped-up charging voltage would be able to meet the requirements of the battery desired charging voltage.

As yet another example, the first adapter outputs a constant-voltage of 5V. When the battery includes a single cell (e.g., a lithium battery cell of which the charging cut-off voltage of a single cell is 4.2V), the conversion circuit (such as a Buck circuit) can perform a step-down conversion on the output voltage of the first adapter so that the stepped-down charging voltage would be able to meet the requirements of the battery desired charging voltage.

As still another example, the first adapter outputs a constant-voltage of 5V. When the first adapter is configured to charge a battery with two or more cells connected in series (e.g., a lithium battery cell of which the charging cut-off voltage of a single cell is 4.2V), the conversion circuit (such as a Boost circuit) can perform a step-up conversion on the output voltage of the first adapter so that the stepped-up charging voltage would be able to meet the requirements of the battery desired charging voltage.

Due to the low conversion efficiency of the conversion circuit, the power of the non-converted part would be dissipated in the form of heat. The heat would accumulate in the inside of the device to the charged (e.g., a terminal); while the space for design and cooling of the device to be charged (e.g., a terminal) are very limited (e.g., the physical size of a mobile terminal used by users becomes increasingly thin, and a large number of electronic components are arranged in the mobile terminal to enhance its performance), which not only improves the design difficulty of the conversion circuit, but also makes it hard to release the heat accumulated inside the device to be charged (e.g., a terminal) in time, thereby causing an abnormality of the device to be charged (e.g., a terminal).

For example, the electronic components near the conversion circuit may be thermally interfered by the heat accumulated in the conversion circuit, which causes the electronic components to work abnormally. For another example, the life of the conversion circuit, as well as the electronic components nearby, may be shortened by the heat accumulated in the conversion circuit. Still further, for example, the battery may be thermally interfered by the heat accumulated in the conversion circuit, leading to the battery being charged or discharging abnormally. In addition, for example, the temperature of the device to be charged (e.g., a terminal) would be caused to rise by the heat accumulated in the conversion circuit, affecting the user experience during the charging process. Moreover, a short circuit of the conversion circuit itself may be caused by the heat accumulated in the conversion circuit, such that the output voltage of the first adapter would be directly applied to both ends of the battery, causing a charging abnormality or even leading to a battery explosion when the battery has been overcharged for a long period of time, resulting in potential security risks.

A second adapter with an adjustable output voltage is provided. The second adapter can acquire status information of a battery. The status information may include at least present power information and/or present voltage information of the battery. The second adapter may adjust its output voltage according to the acquired status information of the battery to meet the requirements of a battery desired charging voltage and/or charging current. In the constant-current charging stage of the battery charging process, the output voltage of the second adapter after adjustment can be applied to both ends of the battery for charging directly.

The second adapter may have the function of a voltage feedback module and the function of a current feedback module to manage the charging voltage and/or charging current of the battery.

By that the second adapter adjusts its output voltage based on the acquired battery status information, it means the second adapter is able to obtain the battery status information in real time and thus adjust its output voltage based on the real-time battery status information obtained each time, so as to meet the battery desired charging voltage and/or charging current.

By that the second adapter adjusts its output voltage based on the acquired battery status information, it may also mean that as the battery voltage continues to rise during the charging process, the second adapter can obtain the battery status information at different times and adjust its output voltage in real time based on the obtained battery status information, thus meeting the requirements of the battery desired charging voltage and/or charging current.

For example, the battery charging process may include at least one selected from a group consisting of a trickle charging stage, a constant-current charging stage, and a constant-voltage charging stage. In the trickle charging stage, the second adapter can output a current (such as a first charging current) to charge the battery which meets the requirements of the battery desired charging current with aid of a current feedback loop. In the constant-current charging stage, the second adapter can output a current (such as a first second charging current, which is greater than the first charging current) to charge the battery which meets the requirements of the battery desired charging current with aid of a current feedback loop; in addition, the charging voltage output from the second adapter can be applied to both ends of the battery for charging directly. In the constant-voltage charging stage, the second adapter may use a voltage feedback loop to make the voltage output from the second adapter meet the requirements of the battery desired charging voltage.

For the trickle charging stage and the constant-voltage charging stage, the voltage output from the second adapter can be processed in a manner similar to that of the first adapter, that is, the voltage can be converted by a conversion circuit of the device to be charged (such as a terminal) to obtain the desired charging voltage and/or charging current of a battery of the device to be charged (such as a terminal).

In order to improve the reliability and safety of the battery charging process, in implementations of the present disclosure, the second adapter can be controlled to output a voltage/current of a pulsating waveform. The second adapter of the implementation will be described in detail below with reference to FIG. 1.

FIG. 1 is a schematic structure diagram illustrating a second adapter according to an implementation. As illustrated in FIG. 1, a second adapter 10 may include a power converting unit 11, a sample and hold unit 12, and a current acquisition and control unit 13.

The power converting unit 11 is configured to convert an input alternating current (AC) to obtain an output voltage and an output current of the second adapter 10, in which the output current of the second adapter 10 is a current of a first pulsating waveform.

The sample and hold unit 12 is connected to the power converting unit 11. When in a sampling state, the sample and hold unit 12 is configured to sample the current of the first pulsating waveform. When in a holding state, the sample and hold unit 12 is configured to hold (or lock) a peak value of the current of the first pulsating waveform.

The current acquisition and control unit 13 is connected to the sample and hold unit 12 and is configured to determine whether the sample and hold unit 12 is in the holding state. When the sample and hold unit 12 is in the holding state, the current acquisition and control unit 13 can acquire the peak value of the current of the first pulsating waveform held by the sample and hold unit 12.

The current output from the second adapter is a current of a first pulsating waveform (also known as pulsating direct current). The current of the pulsating waveform can reduce lithium precipitation phenomenon of a battery. In addition, the current of the pulsating waveform can reduce arcing probability and arcing intensity of the contact(s) of a charging interface, and therefore the service life of the charging interface can be prolonged.

The second adapter will generally adjust the output current thereof according to actual situations. In the case of a second adapter that is operable in a constant-current mode, the second adapter typically adjusts the output current thereof based on the battery voltage of the device to be charged (such as a terminal) and charges the battery in the form of multi-stage constant-current. Therefore, in the charging process, the output current of the second adapter need to be detected and controlled in real time. If the current value of the output current of the second adapter is constant, the detection and control of the output current of the second adapter are relatively easy to achieve. However, the output current of the second adapter is the current of the first pulsating waveform, since the magnitude of the current of the first pulsating waveform is fluctuating, it is necessary to design a detection and control mode dedicated for the output current of the dedicated second adapter.

In view of this, the second adapter is equipped with the sample and hold unit 12 and the current acquisition and control unit 13, on the basis of which the peak value of the output current of the second adapter can be acquired, thereby ensuring that the second adapter can effectively control the output current.

Figure 2A:
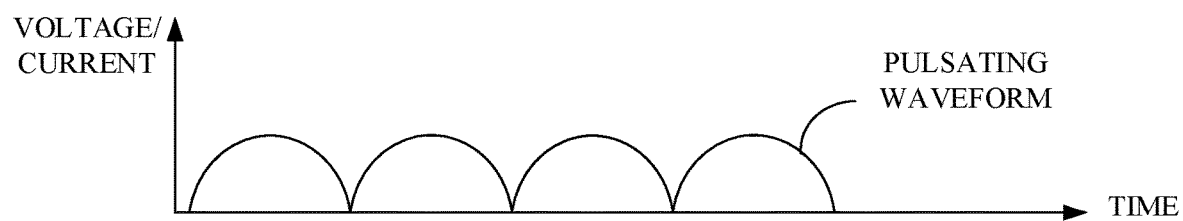
FIG. 2A and FIG. 2B are schematic diagrams illustrating a pulsating waveform according to an implementation.
Figure 2B:
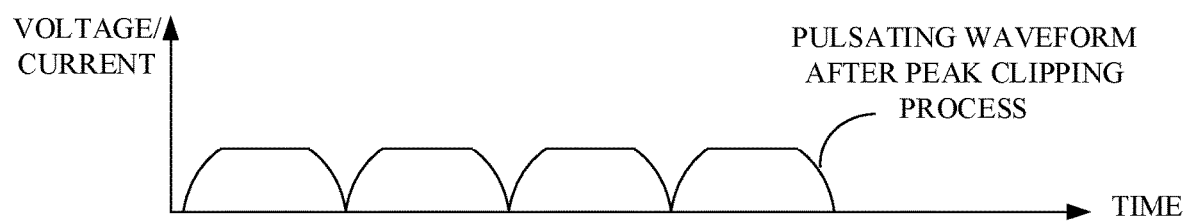

As mentioned above, the output current of the second adapter is the current of the first pulsating waveform. "Pulsating waveform" referred to herein can be a complete pulsating waveform, or may be one obtained from a complete pulsating waveform that undergone a peak clipping process. The so-called "peak clipping process" may refer to filter a portion of the pulsating waveform that exceeds a certain threshold value, thereby achieving a control of the pulsating waveform peak. The pulsating waveform illustrated in FIG. 2A is a complete pulsating waveform while the pulsating waveform illustrated in FIG. 2B is one obtained from a complete pulsating waveform after the peak clipping process.

It is to be understood that the implementation of the present disclosure is not particularly limited to the manner in which the power converting unit 11 converts the alternating current into the current of the first pulsating waveform. For example, a primary filter unit and a secondary filter unit can be removed from the power converting unit 11 to obtain the current of the first pulsating waveform. This can not only allow the second adapter 10 to output the current of the first pulsating waveform, but also significantly reduce the volume of the second adapter 10, which facilitates the miniaturization of the second adapter 10.

The device to be charged known as a "communication terminal" (or simply called a "terminal") as used in the implementations of the disclosure may include, but is not limited to, a device configured to be coupled via a wired line and/or receive/transmit communication signals via a wireless interface. Examples of the wired line may include, but are not limited to, at least one of a public switched telephone network (PSTN), a digital subscriber line (DSL), a digital cable, a cable used for direct connection, and/or another data connection line or network connection line. Examples of the wireless interface may include, but are not limited to, a wireless interface for a cellular network, a wireless local area network (WLAN), a digital television network such as a digital video broadcasting-handheld (DVB-H) network, a satellite network, an AM-FM broadcast transmitter, and/or another communication terminal. A terminal configured to communicate via a wireless interface may be referred to as a "wireless communication terminal", a "wireless terminal", and/or a "mobile terminal". Examples of a mobile terminal may include, but are not limited to, a satellite or cellular telephone, a personal communication system (PCS) terminal capable of combining cellular radio telephone and data processing, fax, and data communication capabilities, a personal digital assistant (PDA) equipped with radio telephone capacity, pager, Internet/Intranet access capacity, Web browser, notebook, calendar, and/or global positioning system (GPS) receiver, and a laptop and/or a handheld receiver or another electronic device equipped with radio telephone capacity.

In some implementations, the second adapter 10 may include a charging interface (such as a charging interface 191 illustrated in FIG. 19A); however, the type of the charging interface according to the implementation is not particularly limited. For example, the charging interface may be a universal serial bus (USB) interface, which may be a standard USB interface, a micro USB interface, or a Type-C interface.

The implementation of the present disclosure is not particularly limited to the implementation of the sample and hold unit 12. Generally, the sample and hold unit 12 may realize the sampling and holding of the signal based on capacitance. The form of the sample and hold unit 12 will be described in detail below with reference to FIG. 3.

Figure 3:
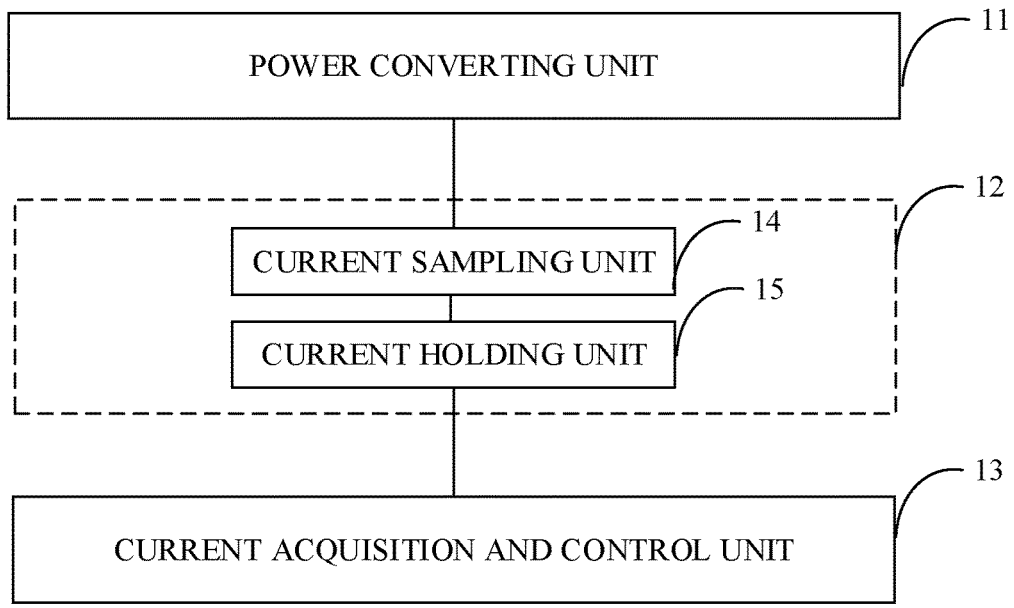
FIG. 3 is a schematic structure diagram illustrating a second adapter according to another implementation.

As one implementation, as illustrated in FIG. 3, the sample and hold unit 12 may include a current sampling unit 14 and a current holding unit 15. The current sampling unit 14 is connected to the power converting unit 11 and configured to detect the current of the first pulsating waveform to get a sampling current, which is then converted to a sampling voltage. The sampling voltage is configured to indicate the magnitude of the current of the first pulsating waveform. The current holding unit 15 is connected to the current sampling unit 14 and the current acquisition and control unit 13. The current holding unit 15 is configured to receive the sampling voltage from the current sampling unit 14 and charge a capacitor (not illustrated in FIG. 3) of the current holding unit 15 on the basis of the sampling voltage received. The current acquisition and control unit 13 is configured to obtain the peak value of the current of the first pulsating waveform by acquiring the voltage across the capacitor of the current acquisition and control unit 13.

When the first pulsating waveform is at the rising edge, the capacitance in the current holding unit 15 rises as the current value of the current of the first pulsating waveform increases, and the sample and hold unit 12 is in the sampling state. When the first pulsating waveform is at the peak or falling edge, the voltage across the capacitor remains unchanged, and the sample and hold unit 12 is in the holding state.

The current acquisition and control unit 13 is configured to acquire the peak value of the current of the first pulsating waveform held by the sample and hold unit 12. In some implementations, the current acquisition and control unit 13 may include an analog-to-digital converter (ADC), and the current acquisition and control unit 13 can acquire the peak value of the current of the first pulsating waveform based on the ADC. In some implementations, the current acquisition and control unit 13 may further include a control unit such as a micro-controller unit (MCU). The control unit may include an ADC port, through which the control unit may be connected to the capacitor of the sample and hold unit 12, thereby acquiring the voltage across the capacitor so as to acquire the peak value of the first pulsating waveform.

When the sample and hold unit 12 is in the sampling state, the voltage across the capacitor rises as the current value of the current of the first pulsating waveform increases, which is equivalent to a charging process. When the sample and hold unit 12 is in the holding state, the voltage across the capacitor reaches its maximum. Correspondences between the voltage across the capacitor and the current of the first pulsating waveform can be set in advance. As such, it is possible for the current acquisition and control unit 13 to know the peak value of the current of the first pulsating waveform by acquiring the value of the voltage across the capacitor.

In other implementations, the current acquisition and control unit 13 can control the sample and hold unit 12 to switch from the holding state to the sampling state after acquiring the peak value of the current of the first pulsating waveform.

The peak value of the current of the first pulsating waveform may be changed in real time. Therefore, it is necessary to continuously detect the peak value of the current of the first pulsating waveform to ensure the real-time capacity and accuracy of current information, thereby ensuring the charging process is smooth. Based on this, after the peak value of the current of the first pulsating waveform is acquired, the current acquisition and control unit 13 provided herein can control the sample and hold unit 12 to switch to the sampling state and resample the current of the first pulsating waveform to ensure the real-time capacity and accuracy of peak value acquisition of the current of the first pulsating waveform.

In some implementations, the current acquisition and control unit 13 may perform a peak value acquisition in each period of the first pulsating waveform and immediately control the sample and hold unit 12 to switch from the holding state to the sampling state after the acquisition of the peak value. As a result, the peak value of the current of the first pulsating waveform acquired by the current acquisition and control unit 13 is updated in real time in units of the period of the first pulsating waveform to ensure the real-time capacity and accuracy of the current peak acquisition of the first pulsating waveform.

It can be seen from the above that the output current of the second adapter 10, i.e., the charging current, is the current of the first pulsating waveform. The charging current can charge the battery intermittently, and the period of the charging current can follow the grid frequency changes. In some implementations, the frequency corresponding to the period of the charging current may be an integer multiple or a reciprocal of the grid frequency. In other words, the charging current can be used to intermittently charge the battery. In some implementations, the charging current may consist of one or a set of pulses synchronized with the grid.

It will be understood that the manner in which the current acquisition and control unit 13 controls the sample and hold unit 12 to switch from the holding state to the sampling state may be varied. For example, the current acquisition and control unit 13 may control the capacitor in the sample and hold unit 12 to discharge to clear the charge across the capacitor, such that the capacitor in the sample and hold unit 12 can be recharged when the next sampling period arrives.

Figure 4:
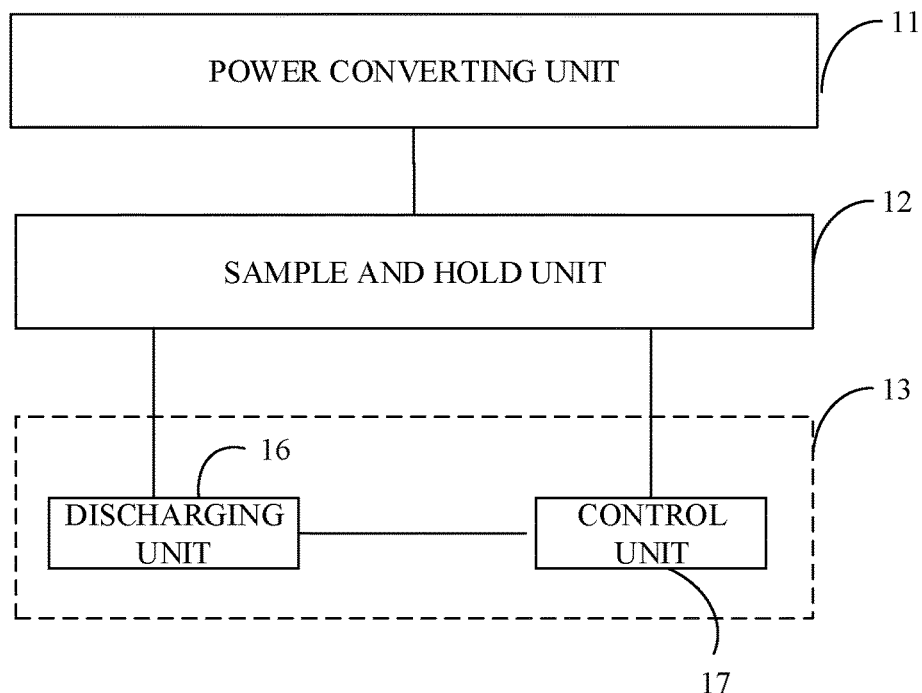
FIG. 4 is a schematic structure diagram illustrating a second adapter according to still another implementation.

In some implementations, as illustrated in FIG. 4, the sample and hold unit 12 may hold the peak of the current of the first pulsating waveform based on the capacitor (not illustrated in FIG. 4) in the sample and hold unit 12. The current acquisition and control unit 13 may include a discharging unit 16 and a control unit 17. The discharging unit 16 is connected to the control unit 17 and the capacitor of the sample and hold unit 12 respectively. The discharging unit 16 is configured to release the charge across the capacitor of the sample and hold unit 12 under the control of the control unit 17, such that the sample and hold unit 12 can be made to switch from the holding state to the sampling state. The control unit 17 can be configured to acquire the peak value of the current of the first pulsating waveform, which is held by the sample and hold unit 12.

The discharging unit 16 may be implemented in a variety of ways. For example, the discharging unit 16 may include a switch(es) and a resistor(s) connected in series with the capacitor in the sample and hold unit 12. When discharging is required, the control unit 17 controls the switch to be switched on, so that the capacitor and the resistor can form a discharging path, whereby the resistor can consume the charge across the capacitor.

The implementation of the present disclosure is not particularly limited to the manner in which the current acquisition and control unit 13 can judge whether or not the sample and hold unit 12 is in the holding state, and will be described in detail with reference to implementations.

In some implementations, the current acquisition and control unit 13 can detect the current value sampled by the sample and hold unit 12 in real time, and if the current value detected continuously twice is kept constant, it indicates that the sample and hold unit 12 is in the holding state.

In some implementations, the current acquisition and control unit 13 is configured to receive a synchronization signal ("sync signal" for short) and judge whether or not the sample and hold unit 12 is in the holding state based on the sync signal. The period of the sync signal is 1/N of the period of the first pulsating waveform, where N is an integer greater than or equal to one.

Since the current of the first pulsating waveform is periodically changed, the time interval between the sampling state and holding state of the sample and hold unit 12 is related to the period of the current of the first pulsating waveform (the time interval may be ½ of the period of the current of the first pulsating waveform). Based on this, implementations introduce a sync signal having a specific relationship with the period of the first pulsating waveform (that is, the period of the sync signal is 1/N of the period of the first pulsating waveform), and judge the operating state of the sample and hold unit 12 based on the sync signal. For example, the relationship between the period and/or phase of the first pulsating waveform and the sync signal may be used to determine whether the first pulsating waveform is at the peak or falling edge. If the first pulsating waveform is at the peak or falling edge, the sample and hold unit 12 is in the holding state. Whether or not the first pulsating waveform is at the peak or falling edge may refer to whether or not the first pulsating waveform is at the peak or falling edge of the first pulsating waveform. Alternatively, whether or not the first pulsating waveform is at the peak or falling edge may refer to whether or not the output current of the second adapter is at the peak or falling edge of the first pulsating waveform, or whether or not the output current of the second adapter is a current corresponding to the peak or falling edge of the first pulsating waveform.

As one implementation, the period of the first pulsating waveform is the same as the period of the sync signal. In addition, as another implementation, the first pulsating waveform can be in phase with the sync signal. In detail, the first pulsating waveform is at the rising edge when the sync signal is at the rising edge, and the first pulsating waveform is at the peak or falling edge when the sync signal is at the peak or falling edge. Since the sample and hold unit 12 is in the holding state when the first pulsating waveform is at the peak or falling edge, therefore, as long as it can judge when the sync signal is at the peak or the falling edge, it is possible to judge when the sample and hold unit 12 is in the holding state. In other implementations, the phase of the first pulsating waveform may differ from the phase of the sync signal by a fixed value, such as 90 degrees or 180 degrees. In this case, it is also possible to determine when the first pulsating waveform is at the peak or falling edge based on the relationship between the period and the phase between the first pulsating waveform and the sync signal, and then it is possible to determine when the sample and hold unit 12 is in the holding state.

Figure 5:
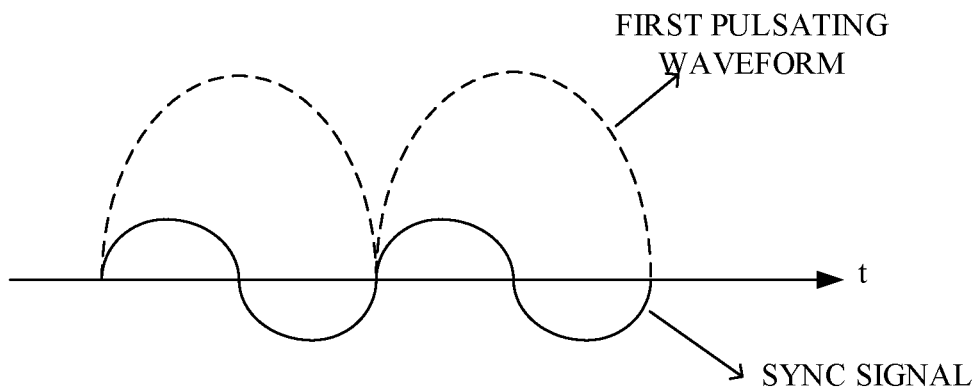
FIG. 5 is a schematic diagram illustrating a phase relationship between a sync signal and a first pulsating waveform.

If the period of the sync signal is ½, ⅓, ¼ of that of the first pulsating waveform, it is also possible to judge the operating state of the sample and hold unit 12 based on the relationship between the phase and the period of the sync signal and the first pulsating waveform. As illustrated in FIG. 5, the waveform of the sync signal is indicated by a solid line, and the waveform of the first pulsating waveform is indicated by a dotted line. The period of the sync signal is ½ of the period of the first pulsating waveform, and when the sync signal is in the negative half cycle, the first pulsating waveform is at the peak or falling edge and the sample and hold unit 12 is in the holding state. Therefore, it is only necessary to determine when the waveform of the sync signal is in the negative half cycle to determine when the first pulsating waveform is at the peak or falling edge. Other similar cases will not be enumerated here.

The sync signal may be a sync signal of a pulsating waveform or a sync signal of a triangular waveform, and other types of sync signals. The present implementation is not particularly limited thereto.

The acquisition method of the sync signal is not particularly limited, and some acquisition methods are given below in connection with implementations.

In some implementations, the current acquisition and control unit 13 is connected to the power converting unit 11 to acquire the sync signal from the power converting unit 11.

It should be noted that, the sync signal acquired from the power converting unit 11 can be at least one selected from a group consisting of: an AC signal received by the power converting unit 11, a current/voltage signal obtained after the primary rectification of the power converting unit 11, a current/voltage signal coupled to a secondary side from a primary side of the power converting unit 11, a current/voltage signal obtained after the secondary rectification, and the present disclosure is not limited thereto.

Figure 6:
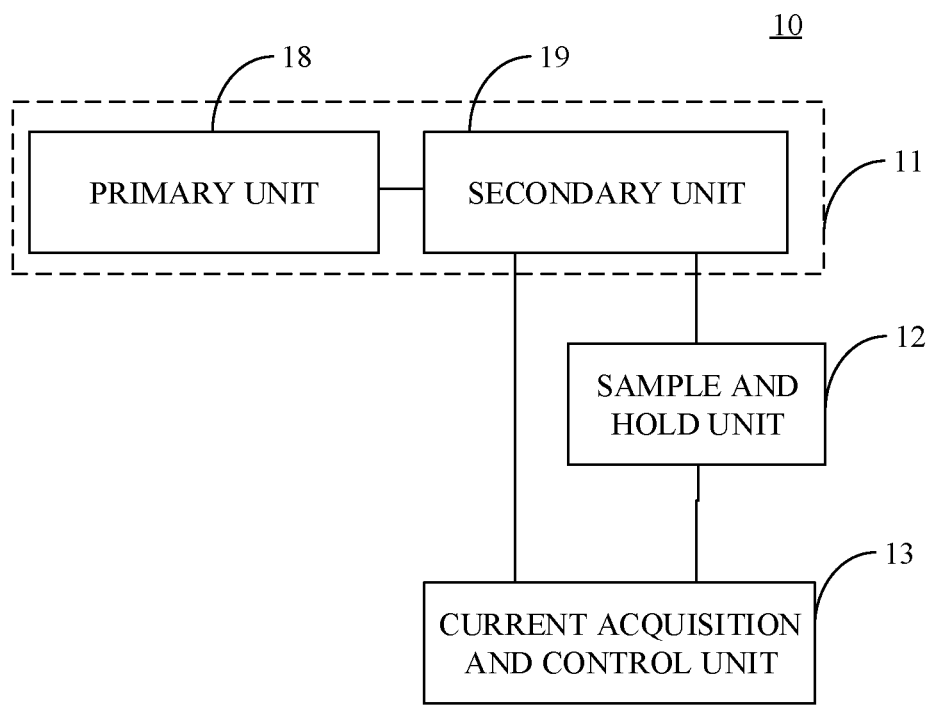
FIG. 6 is a schematic structure diagram illustrating a second adapter according to still another implementation.

As one implementation, as illustrated in FIG. 6, the power converting unit 11 may include a primary unit 18 and a secondary unit 19. The current acquisition and control unit 13 is connected to the secondary unit 19, from which the sync signal will be acquired.

Figure 7:
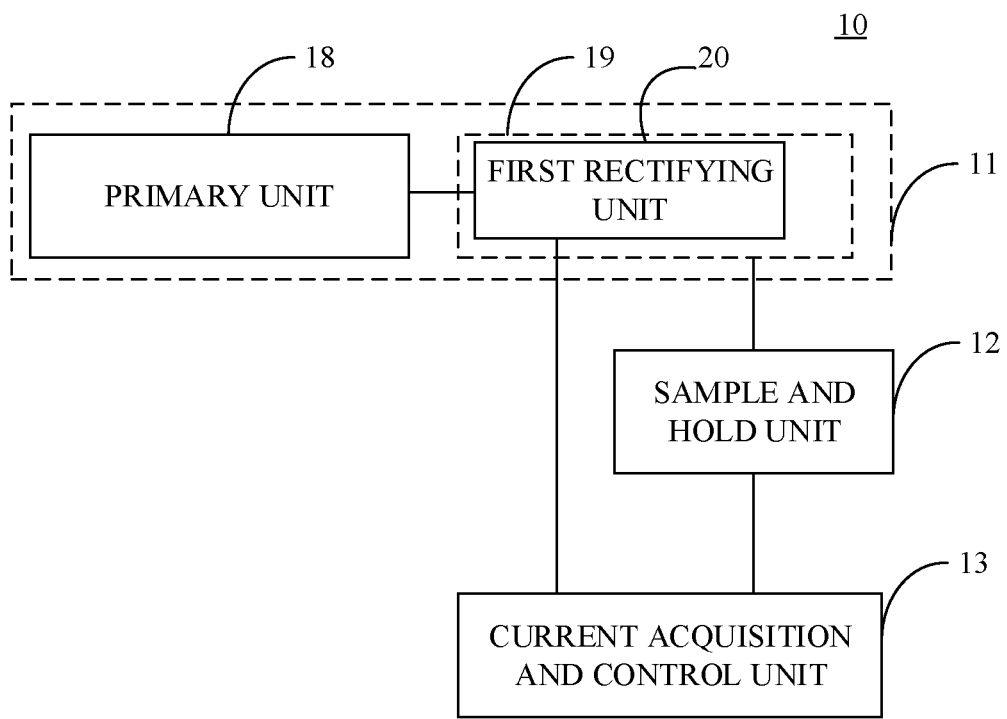
FIG. 7 is a schematic structure diagram illustrating a second adapter according to still another implementation.

It will be understood that there are a variety of ways to obtain a sync signal from the secondary unit 19. For example, the sync signal may be acquired directly from the bus (VBUS) of the secondary unit 19. Since the second adapter 10 outputs a current of the first pulsating waveform and an output end of the second adapter 10 is connected to the bus of the secondary unit 19, the current of the first pulsating waveform flows through the bus of the secondary unit 19. Another example is illustrated in FIG. 7, where the secondary unit 19 may include a first rectifying unit 20, which is connected to the current acquisition and control unit 13. The first rectifying unit 20 is configured to rectify the current coupled to the secondary unit 19 from the primary unit 18 to obtain a voltage of the second pulsating waveform, and transmit a signal of the voltage of the second pulsating waveform as a sync signal to the current acquisition and control unit 13.

Figure 21:
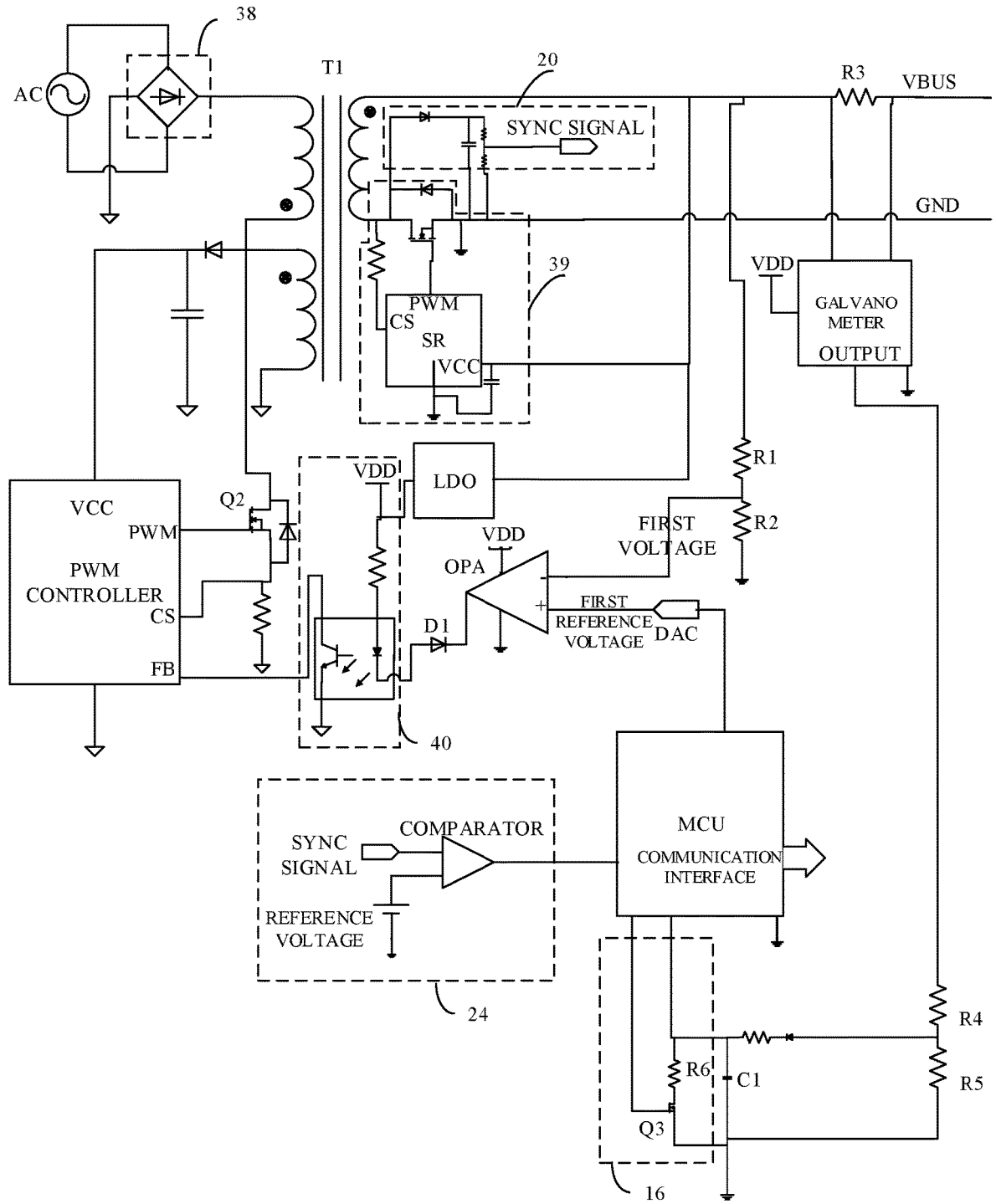
FIG. 21 is a schematic diagram illustrating a circuit structure of a second adapter according to an implementation.

The secondary unit 19 may contain a secondary rectifying unit. The secondary rectifying unit and the above-mentioned first rectifying unit 20 may be two independent rectifying units. The secondary rectifying unit is used to rectify the current coupled to the secondary side from the primary side to obtain the output current of the second adapter. The first rectifying unit is used to rectify the current coupled to the secondary side from the primary side to obtain a sync signal. As illustrated in FIG. 21, a secondary rectifying unit 39 is illustrated. Both the secondary rectifying unit 39 and the first rectifying unit 20 may be located on the side adjacent to a secondary winding of the transformer T1, to rectify the current that is coupled to the secondary side from the primary side by the second adapter.

Figure 8:
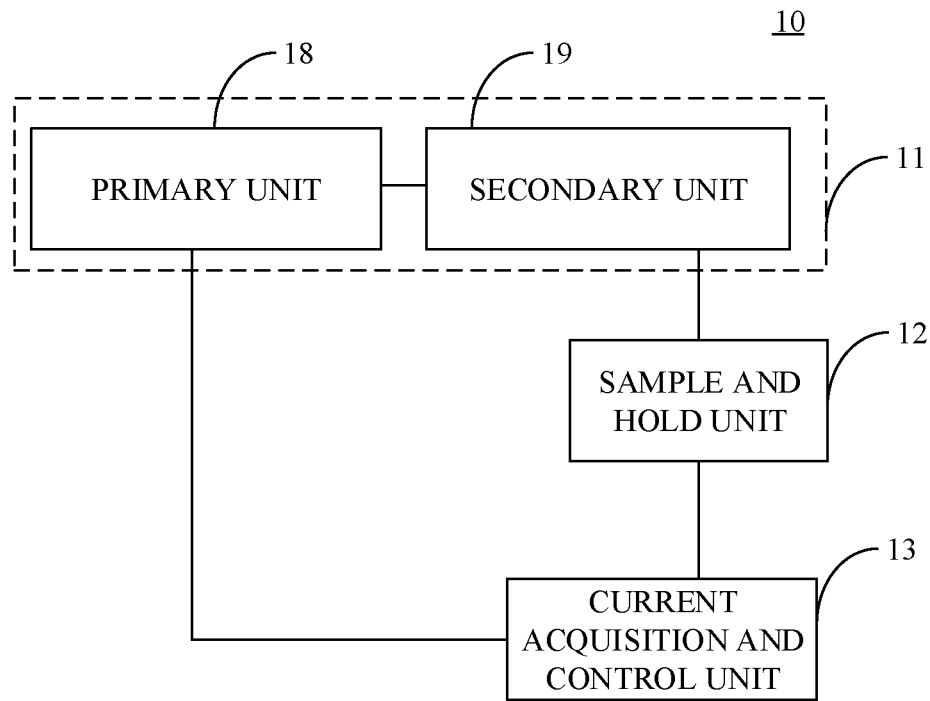
FIG. 8 is a schematic structure diagram illustrating a second adapter according to still another implementation.

In some implementations, as illustrated in FIG. 8, the power converting unit 11 may include a primary unit 18 and a secondary unit 19. The current acquisition and control unit 13 is connected to the primary unit 18 to acquire a sync signal from the primary unit 18.

It will be understood that there are a variety of ways to obtain a sync signal from the primary unit 18. For example, the AC signal may be directly obtained from the primary unit 18, and the AC signal may be transmitted to the current acquisition and control unit 13 as the sync signal. For example, the pulsating DC signal rectified by the rectification circuit in the primary unit 18 may be sent to the current acquisition and control unit 13 as the sync signal.

Figure 9:
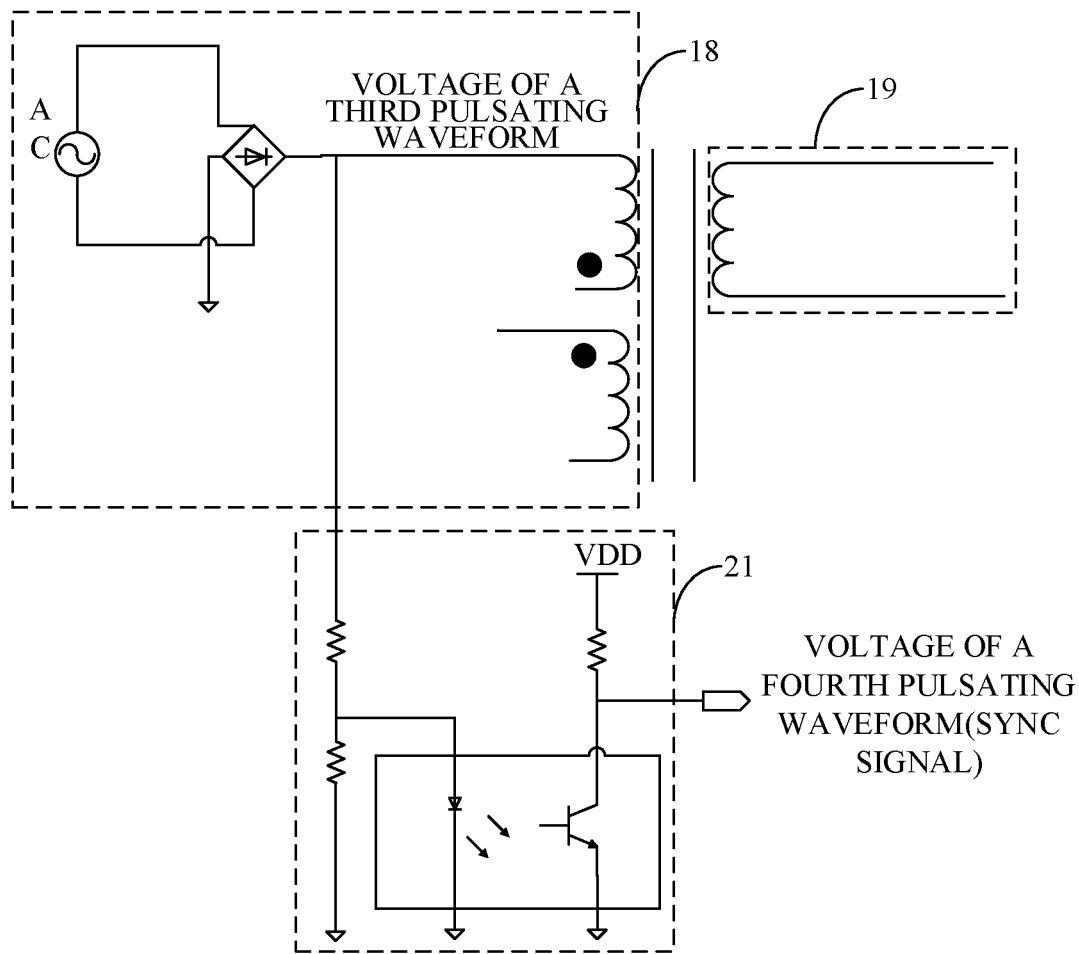
FIG. 9 illustrates acquisition of the sync signal according to an implementation.

As illustrated in FIG. 9, the primary unit 18 rectifies the AC current to obtain a voltage of a third pulsating waveform. The period of the third pulsating waveform is the same as the period of the first pulsating waveform. The primary unit 18 may couple the voltage of the third pulsating waveform from the primary side of the second adapter 10 to the secondary side via an optocoupler unit 21 to obtain a voltage of a fourth pulsating waveform, and transmit the voltage of the fourth pulsating waveform as a sync signal to the current acquisition and control unit 13. The optocoupler unit 21 may serve to isolate the mutual interference between the primary side and the secondary side. As an alternative, the primary unit 18 may also transmit the voltage of the third pulsating waveform directly to the current acquisition and control unit 13 without passing through the optocoupler unit 21, and implementations of the present disclosure are not particularly limited thereto.

The method of obtaining the sync signal from the power converting unit 11 is described in detail with reference to implementations, however, the method for obtaining the sync signal is not limited thereto and other methods are given below.

As one implementation, the current acquisition and control unit 13 can acquire the sync signal from the sample and hold unit 12.

The sample and hold unit 12 samples the output current of the second adapter, i.e., the current of the first pulsating waveform, to obtain a sampling current. The sampling current, a sampling voltage corresponding to the sampling current, or any other signal has a same period and phase as the current of the first pulsating waveform. The sampling current or the sampling voltage as the sync signal can simplify the judgment logic of the operating state of the sample and hold unit 12.

In general, the sample and hold unit 12 samples the current of the first pulsating waveform to obtain a sampling current and converts the sampling current into a sampling voltage. The sampling voltage can indicate the magnitude of the current of the first pulsating waveform. The sample and hold unit 12 may transmit the sampling voltage to the current acquisition and control unit 13 as a sync signal. For example, the voltage signal output from the output port (OUTPUT) of the galvanometer of FIG. 21 may be used as the sync signal.

The above describes the sync signal acquisition method. Hereinafter, a method for judging based on a sync signal whether or not the first pulsating waveform is at the peak or falling edge is described in detail with reference to implementations.

In some implementations, the current acquisition and control unit 13 determines whether the first pulsating waveform is at the peak or falling edge based on the sync signal, and the peak value of the current of the first pulsating waveform held by the sample and hold unit 12 is acquired in the case where it is judged that the first pulsating waveform is at the peak or the falling edge.

The sample and hold unit 12 can switch between the sampling state and the holding state based on the charging and discharging of the capacitor. When the first pulsating waveform is at the rising edge, the capacitor contained in the sample and hold unit 12 is in the charging state, the voltage across the capacitor rises as the current of the first pulsating waveform increases, and at this time, the sample and hold unit 12 is in the sampling state. When the first pulsating waveform is at the peak or falling edge, the voltage across the capacitor does not continue to rise, and at this time, the sample and hold unit 12 is in the holding state. Therefore, it is possible to determine when the sample and hold unit 12 is in the holding state by judging when the first pulsating waveform is at the peak or the falling edge. Since the period and phase of the sync signal have a fixed relationship with the period and phase of the first pulsating waveform, thus, it is possible to determine whether the first pulsating waveform is at the peak or falling edge based on the period and/or phase of the sync signal. For example, when the phase of the sync signal is the same as the phase of the first pulsating waveform, the first pulsating waveform is at the peak or falling edge when the sync signal is at the peak or falling edge. Another example, the period of the sync signal is the same as the period of the first pulsating waveform, meanwhile, the difference between the phase of the sync signal and the phase of the first pulsating waveform is half a period, in this case, the first pulsating waveform is at the peak or falling edge when the sync signal is at the rising edge.

There are several ways to detect the phase of the sync signal. For example, the current or voltage of the sync signal can be detected in real time by a galvanometer or a voltmeter to determine the phase of the sync signal, and then it can be determined whether the first pulsating waveform is at the peak or falling edge. However, this implementation requires additional current and voltage detection circuit, which is complex. Two comparator-based implementations are given below to compare the voltage of the sync signal with a reference voltage to easily determine whether the first pulsating waveform is at the peak or falling edge.

Figure 10:
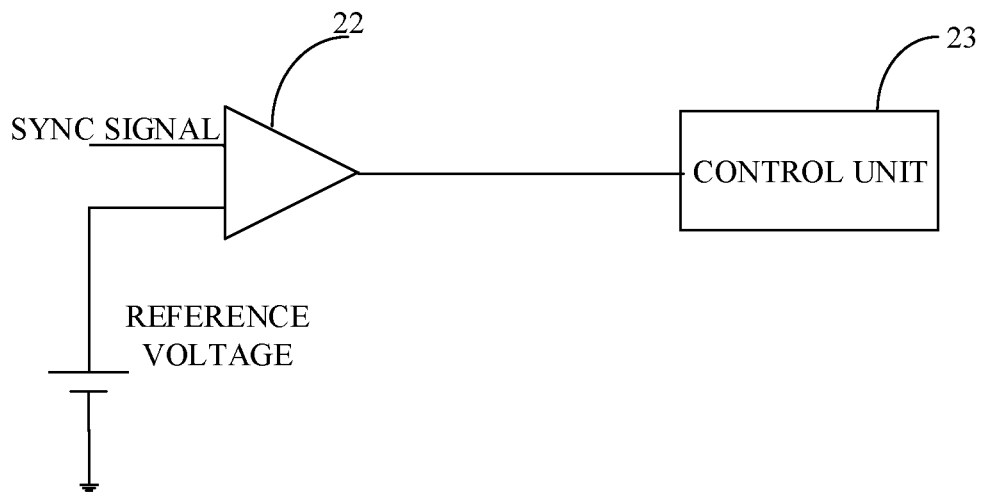
FIG. 10 is a schematic structure diagram of a current acquisition and control unit according to an implementation.

In some implementations, as illustrated in FIG. 10, the current acquisition and control unit 13 may include a comparator 22 and a control unit 23. A first input end of the comparator 22 is configured to receive the sync signal and a second input end of the comparator 22 is configured to receive a reference voltage. The control unit 23 is connected to an output end of the comparator 22 and is configured to determine whether or not the first pulsating waveform is at the peak or falling edge based on a comparison result of the voltage of the sync signal and the reference voltage. In some implementations, the first input end is an in-phase input end of the comparator and the second input end is a reversed-phase input end of the comparator. In other implementations, the first input end is the reversed-phase input end of the comparator and the second input end is the in-phase input end of the comparator.

It is to be understood that the manner in which the voltage value of the reference voltage is selected is not particularly limited. Assuming that the sync signal is a pulsating waveform signal at a zero-crossing point, the voltage value of the reference voltage can be set to be greater than zero and less than the peak value of the sync signal. Assuming that the sync signal is an AC signal, the voltage value of the reference voltage can be set as zero.

Figure 11:
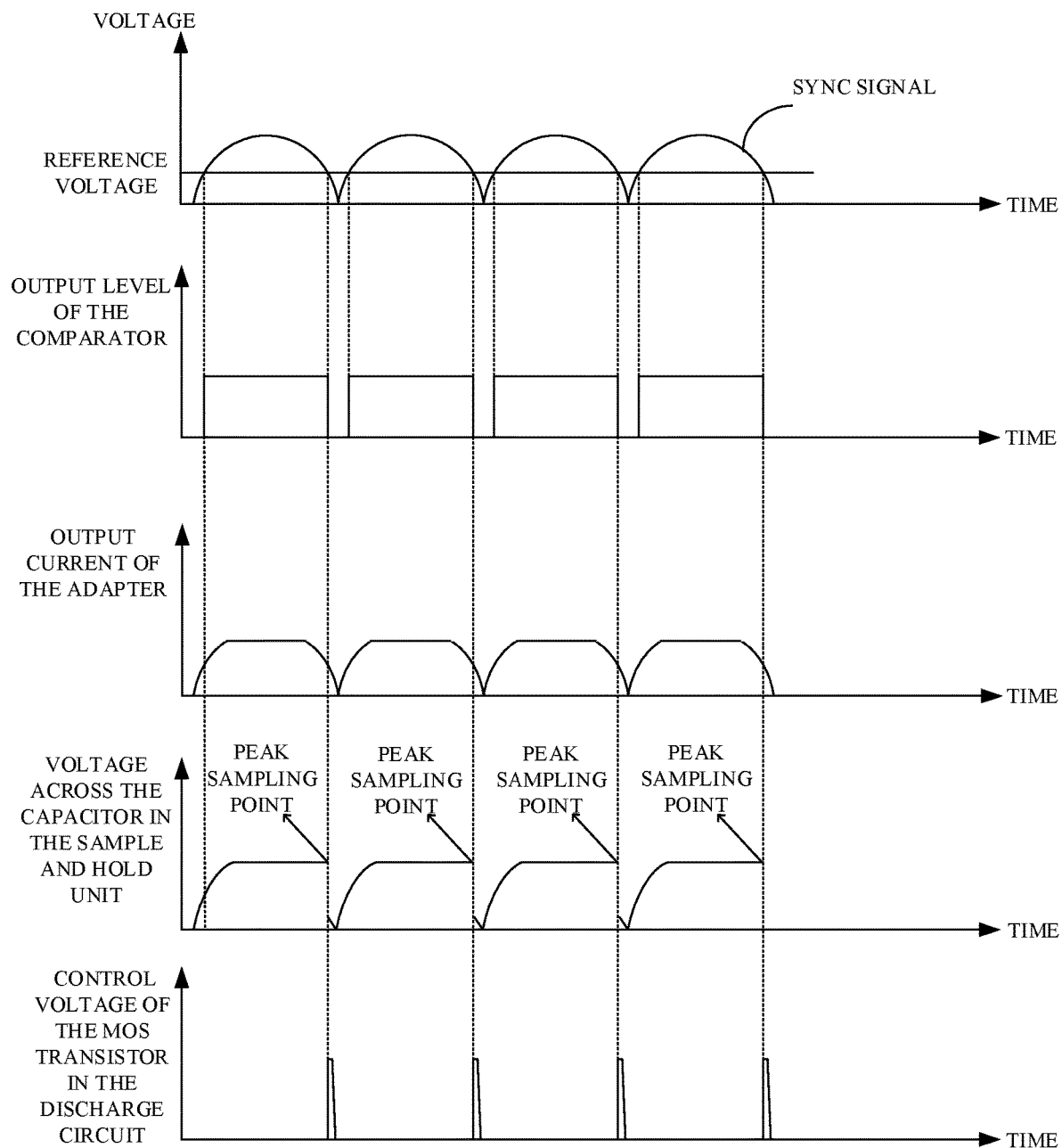
FIG. 11 is a schematic diagram illustrating a waveform relationship among a reference voltage, an output level of a comparator, and an output current of a second adapter according to an implementation.
Figure 12:
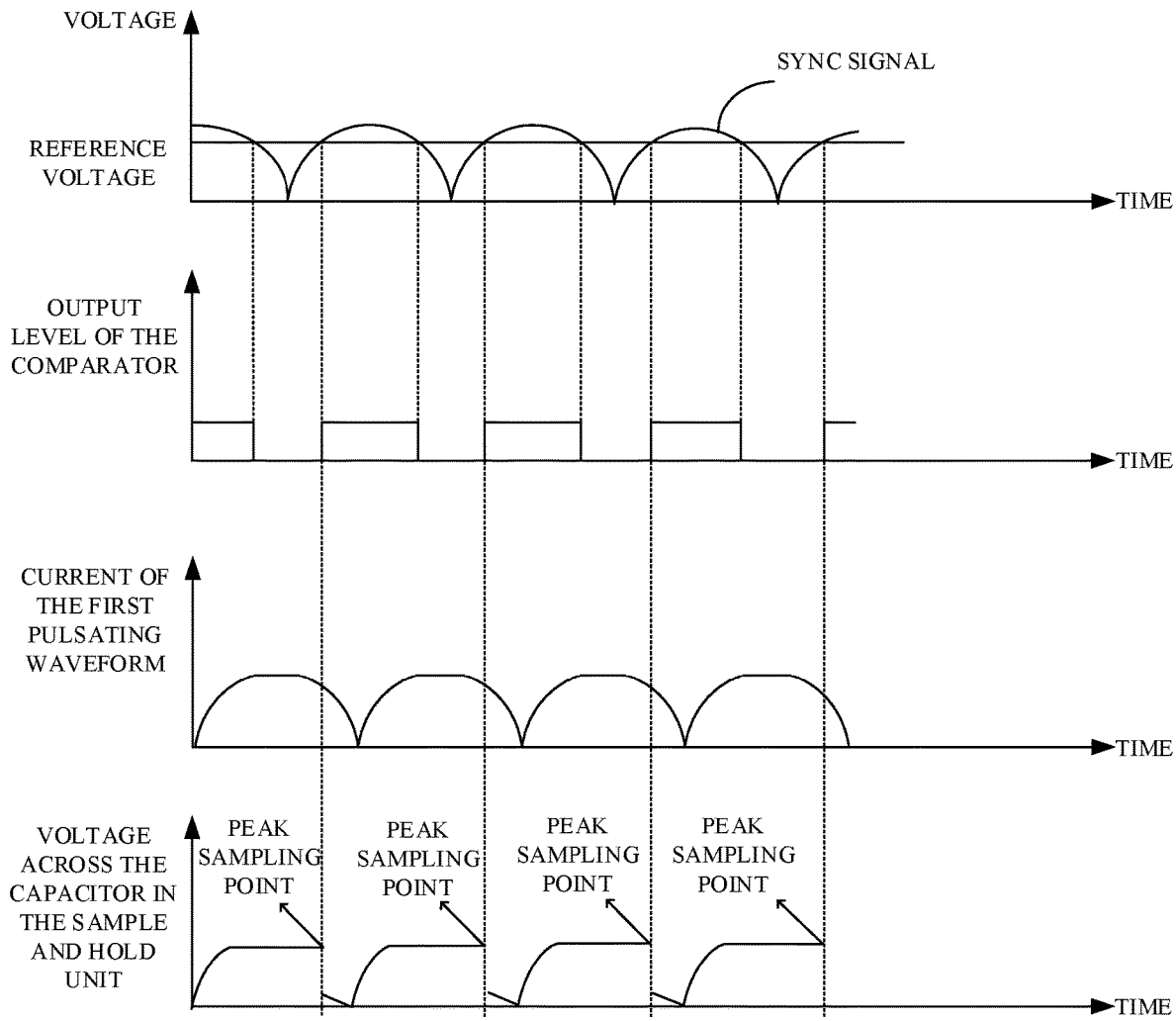
FIG. 12 is a schematic diagram illustrating a waveform relationship among a reference voltage, an output level of a comparator, and an output current of a second adapter according to another implementation.

In addition, there are several ways to determine whether the first pulsating waveform is at the peak or the falling edge based on the comparison between the voltage of the sync signal and the reference voltage, which may be related to the period and phase of the sync signal and the period and phase of the first pulsating waveform, and implementations of the present disclosure is not specifically limited. In the following, the manner in which the peak or the falling edge of the first pulsating waveform is determined will be exemplified below in conjunction with FIG. 11 and FIG. 12, where the period of the sync signal is the same as the period of the first pulsating waveform. In implementations of FIG. 11 and FIG. 12, the current acquisition and control unit 13 acquires, in each period of the first pulsating waveform, the peak value of the current of the first pulsating waveform held by the sample and hold unit. After the acquisition is completed, the current acquisition and control unit 13 immediately supplies a control voltage to a MOS transistor in the discharging unit, which is configured to control the MOS transistor in the discharging unit to switch on, so that the charge across the capacitor in the sample and hold unit 12 can be released. FIG. 11 and FIG. 12 are merely illustrative and the implementations of the present disclosure are not limited thereto. For example, the current acquisition and control unit 13 may acquire the peak value of the current of the first pulsating waveform at intervals of multiple periods. In addition, the discharging unit may be implemented in a manner other than the MOS transistor, and other types of switching elements may be used to switch on or off the discharging unit.

In the implementation of FIG. 11, the sync signal and the first pulsating waveform (the first pulsating waveform is a pulsating waveform after a peak clipping process) are in phase. As can be seen from FIG. 11, since the sync signal and the first pulsating waveform are in phase, the first pulsating waveform is also at the peak or falling edge when the sync signal is at the peak or falling edge. Therefore, it is possible to know when the first pulsating waveform is at the peak or the falling edge as long as it has been determined when the sync signal is at the peak or falling edge of the waveform of the sync signal.

Further, in order to determine when the sync signal is at the peak or falling edge, the implementation of FIG. 11 introduces waveform output from the comparator. The comparator compares the voltage value of the sync signal and the reference voltage to obtain a voltage curve of an output level of the comparator, that is, the rectangular wave as illustrated in FIG. 11. From the rectangular wave, it can be seen that when the output level of the comparator is switched from the high level to the low level (hereinafter referred to as "target time"), the first pulsating waveform is at the falling edge. At this time, the capacitor in the sample and hold unit 12 is in the holding state. Thus, the implementation takes the target time as the peak sampling point, and controls the current acquisition and control unit 13 to acquire the voltage across the capacitor in the sample and hold unit 12 to obtain the peak value of the current of the first pulsating waveform. Immediately after acquiring the peak value of the current of the first pulsating waveform, the MOS transistor in the discharging unit is controlled to be switched on, so that the charge across the capacitor in the sample and hold unit 12 is released to prepare for the next cycle of acquisition.

In the implementation of FIG. 12, the phase difference between the sync signal and the first pulsating waveform is 180°, and the first pulsating waveform is a pulsating waveform after the peak clipping process. As can be seen from FIG. 12, since the phase difference between the sync signal and the first pulsating waveform is 180°, the first pulsating waveform is at the peak or falling edge when the sync signal is at the peak or rising edge. Therefore, as long as it is determined when the sync signal is at the peak or rising edge, it is possible to know when the first pulsating waveform is at the peak or falling edge.

Further, in order to determine when the sync signal is at the peak or rising edge, the implementation of FIG. 12 introduces waveform output from the comparator. The comparator compares the voltage value of the sync signal and the reference voltage to obtain a voltage curve of the output level of the comparator, that is, the rectangular wave as illustrated in FIG. 12. From the rectangular wave, it can be seen that when the output level of the comparator is switched from the low level to the high level (hereinafter referred to as "target time"), the first pulsating waveform is at the falling edge. At this time, the capacitor in the sample and hold unit 12 is in the holding state. Thus, the implementation takes the target time as the peak sampling point, and controls the current acquisition and control unit 13 to acquire the voltage across the capacitor in the sample and hold unit 12 to obtain the peak value of the current of the first pulsating waveform. Immediately after acquiring the peak value of the current of the first pulsating waveform, the MOS transistor in the discharging unit is controlled to be switched on, so that the charge across the capacitor in the sample and hold unit 12 is released to prepare for the next cycle of acquisition.

Figure 13:
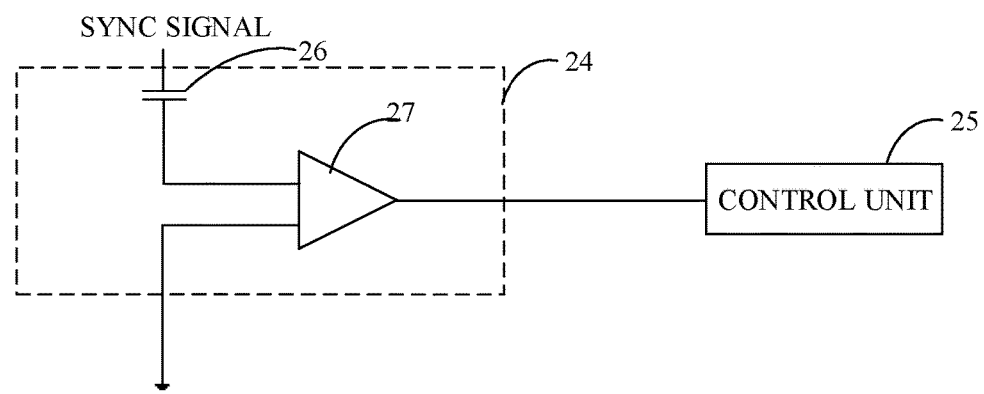
FIG. 13 is a schematic structure diagram illustrating a current acquisition and control unit according to another implementation.

In other implementations, as illustrated in FIG. 13, the current acquisition and control unit 13 may include a comparing unit 24 and a control unit 25. The comparing unit 24 may include a capacitor 26 and a comparator 27. The capacitor 26 is configured to receive the sync signal and filter out the DC signal in the sync signal to obtain a zero-crossing point AC signal. The comparator 27 has a first input end connected to the capacitor 26 to receive the AC signal. The comparator 27 has a second input end configured to receive the reference voltage. The comparator 27 is configured to compare the voltage of the AC signal with the reference voltage. The control unit 25 is connected to the output end of the comparator 27, and determines whether or not the first pulsating waveform is at the peak or falling edge based on the comparison result of the voltage of the AC signal and the reference voltage. As one implementation, the voltage value of the reference voltage can be set to zero. As one implementation, the first input end is the in-phase input end of the comparator and the second input end is the reversed-phase input end of the comparator. In other implementations, the first input end is the reversed-phase input end of the comparator and the second input end is the in-phase input end of the comparator.

The signal of the pulsating waveform can be regarded as a signal obtained by mixing a DC signal (or a DC component) and a zero-crossing AC signal (or an AC component), for example, in which the sync signal is a pulsating waveform signal. The capacitor 26 can filter out the DC signal in the pulsating waveform signal, leaving the zero-crossing point AC signal. In this implementation, the reference voltage of the comparator 27 can be set to zero (for example, the second input end of the comparator is grounded) to easily determine the phase of the sync signal.

In the implementation of the present disclosure, there can be a plurality of ways to determine, based on the AC signal and the reference voltage, whether the first pulsating waveform is at the peak or falling edge and whether the sync signal is at the peak or falling edge, which are related to the period and phase of the AC signal and the period and phase of the first pulsating waveform. The method of judgment is similar to that described in FIG. 11 and FIG. 12 and therefore is not described here in detail.

The manner in which the current peak value of the first pulsating waveform is obtained is described in detail above. The method for controlling the charging process based on the peak value of the current of the acquired first pulsating waveform is described in detail below in connection with implementations.

Figure 14:
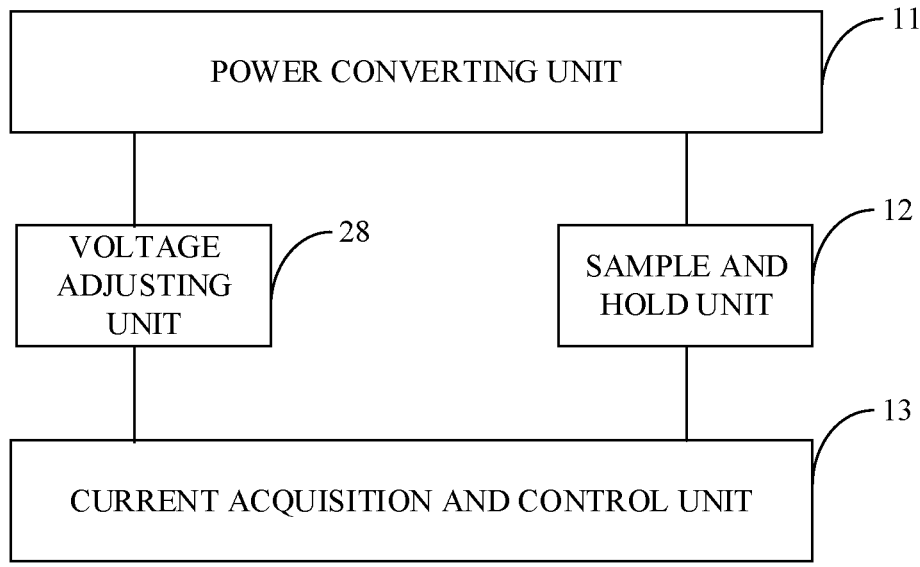
FIG. 14 is a schematic structure diagram of a second adapter according to still another implementation.

In some implementations, the second adapter 10 may also include a voltage adjusting unit 28, as illustrated in FIG. 14. The voltage adjusting unit 28 is connected to the power converting unit 11 and is configured to detect and adjust the output voltage of the second adapter 10. The current acquisition and control unit 13 is connected to the voltage adjusting unit 28 and is configured to adjust the peak value of the current of the first pulsating waveform via the voltage adjusting unit 28.

It will be appreciated that the most basic function of the voltage adjusting unit 28 is to achieve the adjustment of the output voltage of the second adapter. Specifically, the voltage adjusting unit 28 may detect and adjust the output voltage of the second adapter 10 through the power converting unit 11. In other words, the voltage adjusting unit 28 and the power converting unit 11 form a feedback control system for the output voltage of the second adapter, which may also be referred to as a voltage feedback loop. It will be appreciated that in the case when the output power of the second adapter is constant, the adjustment of the voltage will also cause a change in current. Therefore, the current acquisition and control unit 13 of the implementation of the present disclosure can adjust the current by using the voltage feedback loop after acquiring the peak value of the current of the first pulsating waveform. For example, the current acquisition and control unit 13 may calculate, by software, the target value of the output voltage of the second adapter 10 when the peak value of the current of the first pulsating waveform is adjusted to a target peak value, if it is desired to adjust the current peak to the target peak after acquiring the peak value of the current of the first pulsating waveform. Thereafter, the output voltage of the second adapter 10 can be adjusted to the calculated target value by means of the voltage feedback loop.

The current acquisition and control unit 13 and the voltage feedback loop of the implementation of the present disclosure form a feedback control system for the peak value of the output current of the second adapter. The feedback control system may also be referred to as a current feedback loop. That is, implementations of the present disclosure include both a voltage feedback loop (implemented by hardware) and a current feedback loop (based on the voltage feedback loop, implemented by software), such that the second adapter can achieve the control of the output voltage of the second adapter and also the control of the output current of the second adapter, which enriches the function of the second adapter and improves the intelligence level of the second adapter.

The current acquisition and control unit 13 may adjust the peak value of the current of the first pulsating waveform through the voltage adjusting unit 28 in a variety of ways. Hereinafter, examples will be given with reference to FIG. 15 and FIG. 17.

Figure 15:
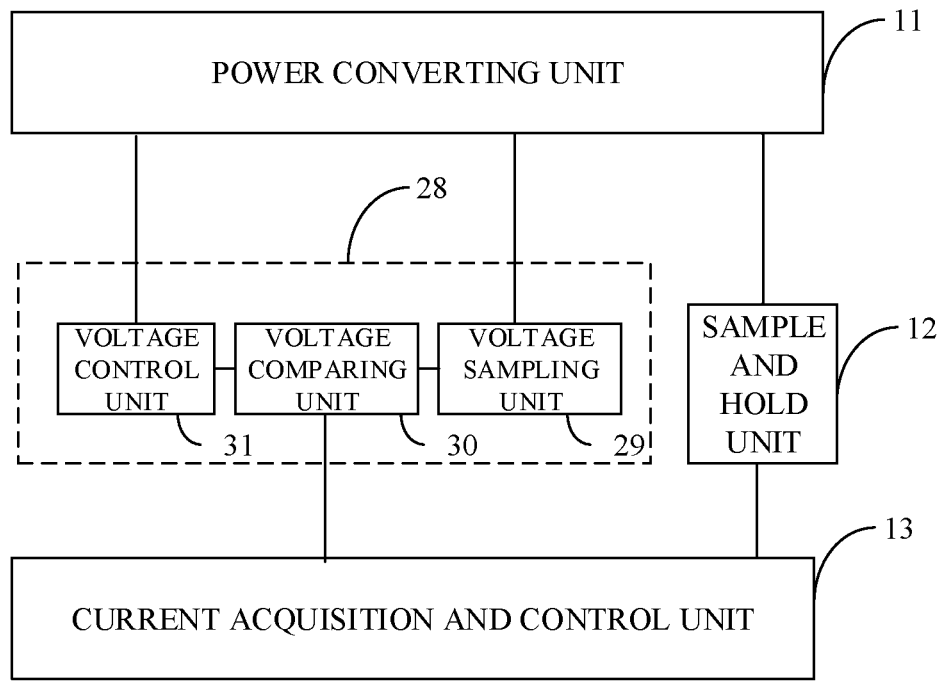
FIG. 15 is a schematic structure diagram of a second adapter according to still another implementation.

In some implementations, the voltage adjusting unit 28 may include a voltage sampling unit 29, a voltage comparing unit 30, and a voltage control unit 31, as illustrated in FIG. 15. The voltage sampling unit 29 is connected to the power converting unit 11 for sampling the output voltage of the second adapter 10 to obtain a first voltage. The voltage comparing unit 30 has an input end connected to the voltage sampling unit 29 for comparing the first voltage and a first reference voltage. The voltage control unit 31 has an input end connected to an output end of the voltage comparing unit 30. The voltage control unit 31 has an output end connected to the power converting unit 11. The voltage control unit 31 controls the output voltage of the second adapter 10 based on the comparison result of the first voltage and the first reference voltage. The current acquisition and control unit 13 is connected to the voltage comparing unit 30 to adjust the peak value of the current of the first pulsating waveform by adjusting the voltage value of the first reference voltage.

In particular, an input end of the voltage sampling unit 29 may be connected to the bus (VBUS) of the second adapter to acquire the output voltage of the second adapter. In some implementations, the voltage sampling unit 29 may be a traverse. As a result, the first voltage sampled by the voltage sampling unit 29 is the output voltage of the second adapter. In other implementations, the voltage sampling unit 29 may include two resistors for voltage division. In this way, the first voltage sampled by the voltage sampling unit 29 is the voltage obtained after voltage division of the two resistors. The voltage comparing unit 30 may be implemented by an operational amplifier ("OP AMP" for short). The OP AMP has one input end configured to receive the first voltage input by the voltage sampling unit 29 and the other input end configured to receive the first reference voltage. An output end of the OP AMP generates a voltage feedback signal to indicate whether the first voltage and the first reference voltage are equal. The voltage control unit 31 may be implemented based on an optocoupler, a PWM controller, or other devices and adjust the output voltage of the second adapter based on the voltage feedback signal provided by the voltage comparing unit 30. The current acquisition and control unit 13 may calculate a desired value of the output voltage of the second adapter based on the desired value of the peak value of the current of the first pulsating waveform in the case when the output power of the second adapter is constant. Then, the output voltage of the second adapter is adjusted to the desired value of the output voltage of the second adapter by adjusting the voltage value of the first reference voltage, thereby adjusting the peak value of the current of the first pulsating waveform to the desired value of the peak value of the current of the first pulsating waveform.

Figure 16:
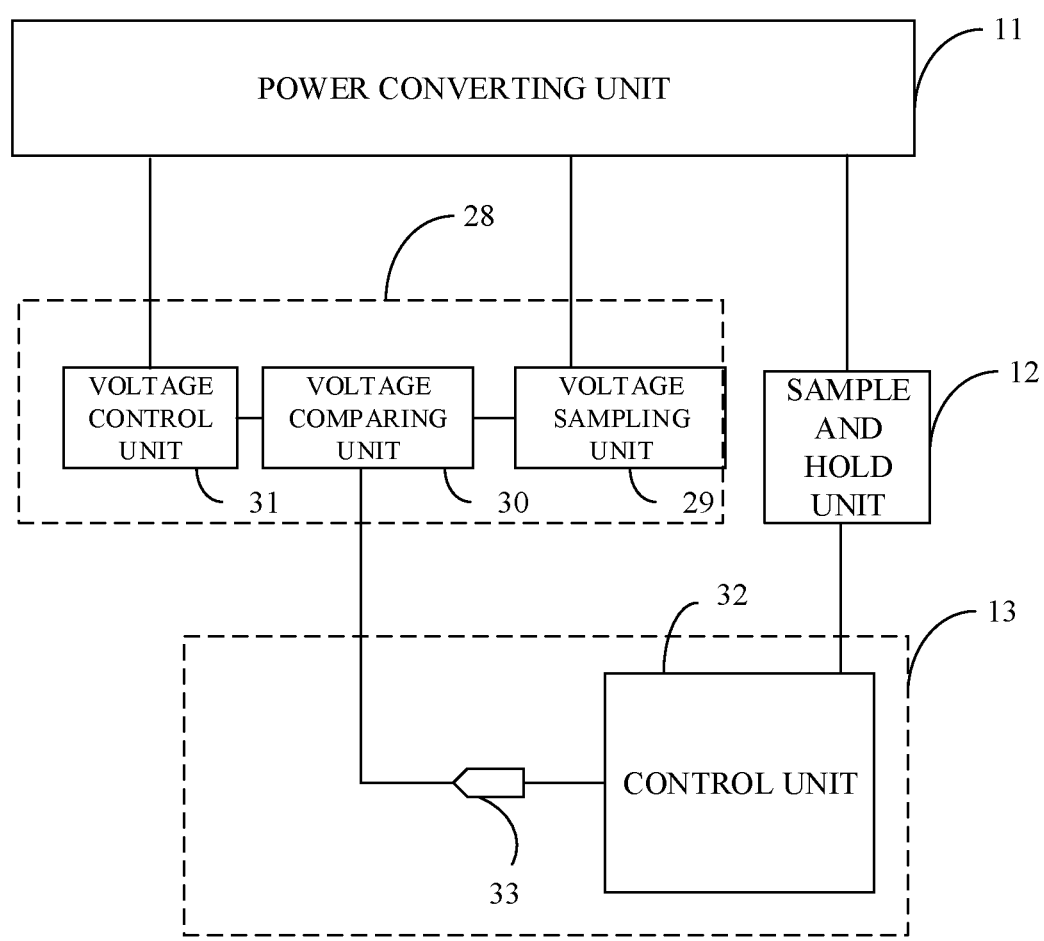
FIG. 16 is a schematic structure diagram of a second adapter according to still another implementation.

The current acquisition and control unit 13 may adjust the voltage value of the first reference voltage in a plurality of ways. As one implementation, as illustrated in FIG. 16, the current acquisition and control unit 13 may include a control unit 32 and a digital to analog converter (DAC) 33. An input end of the DAC 33 is connected to the control unit 32, and an output end of the DAC 33 is connected to the voltage comparing unit 30. The control unit 32 adjusts the voltage value of the first reference voltage via the DAC 33 to adjust the peak value of the current of the first pulsating waveform. As another implementation, the control unit 32 may also achieve the adjustment of the voltage value of the first reference voltage by means of an RC unit, a digital potentiometer or the like, the implementations of the present disclosure are not particularly limited thereto.

Figure 17:
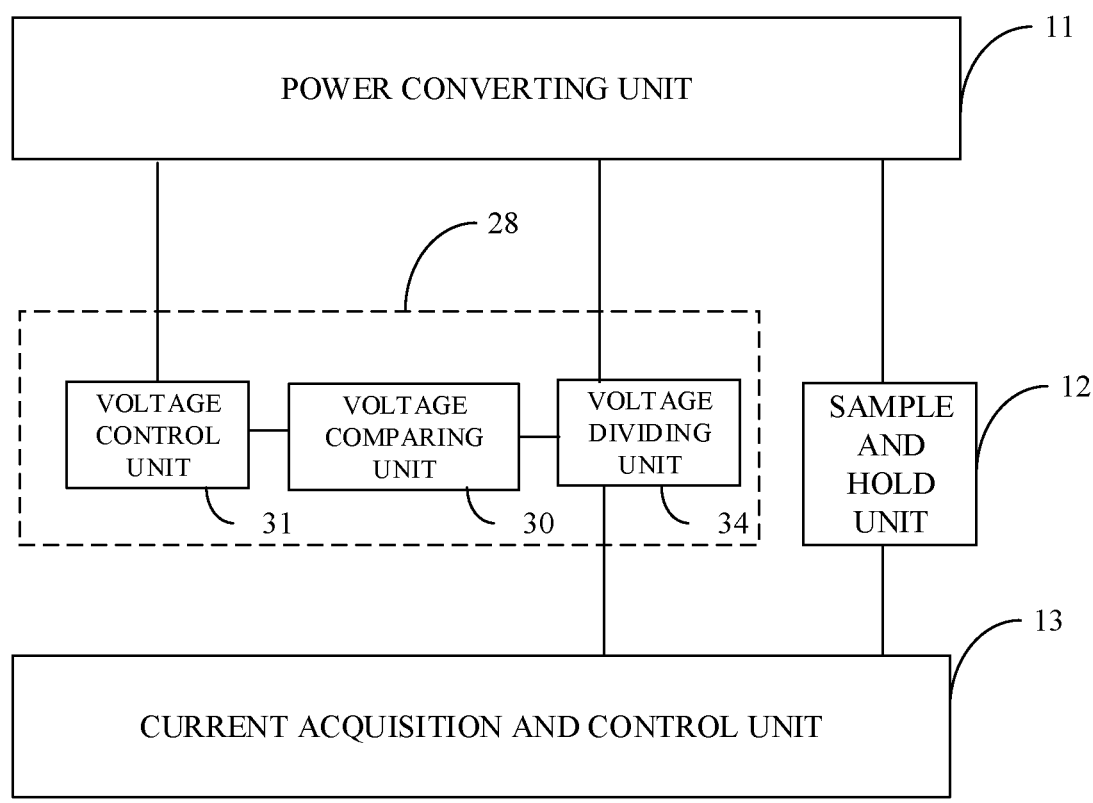
FIG. 17 is a schematic structure diagram of a second adapter according to still another implementation.

In some implementations, the voltage adjusting unit 28 may include a voltage dividing unit 34, a voltage comparing unit 30, and a voltage control unit 31, as illustrated in FIG. 17. An input end of the voltage dividing unit 34 is connected to the power converting unit 11, and is configured to divide the output voltage of the second adapter 10 by a voltage division ratio to generate a second voltage. An input end of the voltage comparing unit 30 is connected to an output end of the voltage dividing unit 34, and is configured to compare the second voltage with a second reference voltage. An input end of the voltage control unit 31 is connected to the input end of the voltage comparing unit 30. An output end of the voltage control unit 31 is connected to the power converting unit 11. The voltage control unit 31 controls the output voltage of the second adapter 10 based on the comparison result between the second voltage and the second reference voltage. The current acquisition and control unit 13 is connected to the voltage comparing unit 30, and the peak value of the current of the first pulsating waveform is adjusted by adjusting a voltage division ratio.

This implementation is similar to the implementation of FIG. 15 except that a voltage dividing unit is provided. The voltage division ratio of the voltage dividing unit is adjustable. Instead of adjusting the peak value of the current of the first pulsating waveform by adjusting the reference voltage of the voltage comparing unit 30, the current acquisition and control unit 13 in the implementation adjusts the peak value of the current of the first pulsating waveform by adjusting the voltage division ratio of the voltage dividing unit 34. With aid of the voltage dividing unit, a sampling of the output voltage of the second adapter and adjustment of the peak value of the current of the first pulsating waveform are achieved, and the circuit structure of the second adapter is simplified.

It is to be understood that since the implementation adjusts the peak value of the current of the first pulsating waveform by adjusting the voltage division ratio of the voltage dividing unit, the reference voltage (i.e., the second reference voltage mentioned above) of the voltage comparing unit in the implementation can be a fixed value.

The voltage dividing unit 34 of the implementation can be implemented in various ways. For example, a digital potentiometer, discrete resistors, switches and other components can be adopted to achieve the above-mentioned voltage division function and voltage division ratio adjustment function.

Figure 18:
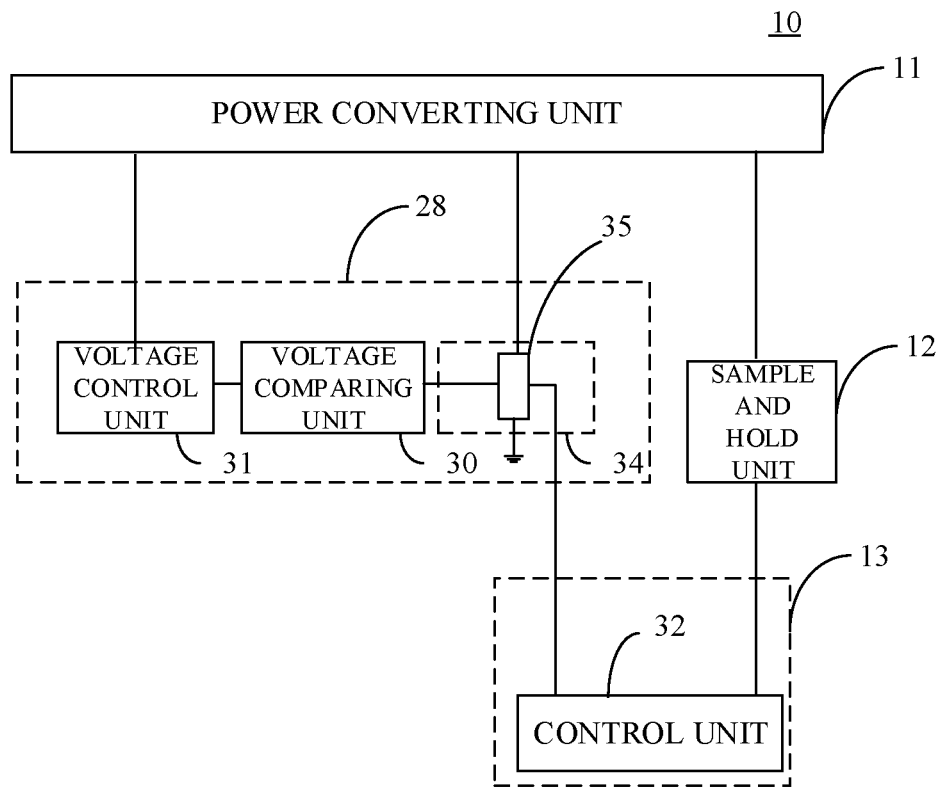
FIG. 18 is a schematic structure diagram of a second adapter according to still another implementation.

Take the digital potentiometer as an example for illustrating. As illustrated in FIG. 18, the current acquisition and control unit 13 includes a control unit 32, and the voltage dividing unit 34 includes a digital potentiometer 35. A high potential side of the digital potentiometer 35 is connected to the power converting unit 11. A low potential side of the digital potentiometer 35 is grounded. An output end of the digital potentiometer 35 is connected to the voltage comparing unit 30. The control unit 32 is connected to a control end of the digital potentiometer 35 and adjusts the voltage division ratio of the digital potentiometer 35 via the control end of the digital potentiometer 35, so as to adjust the peak value of the current of the first pulsating waveform.

In some implementations, the second adapter 10 is operable in a first charging mode and a second charging mode. When the second adapter 10 charges the device to be charged (such as a terminal), the charging speed of the second charging mode is faster than the charging speed of the first charging mode. The current of the first pulsating waveform can be the output current of the second adapter in the second charging mode. In other words, compared with the situation where the second adapter 10 operates in the first charging mode, the second adapter 10 operating in the second charging mode takes less time to fully charge a battery with the same capacity in a device to be charged (such as a terminal).

The second adapter 10 includes a control unit. The control unit performs two-way communication (in other words, bidirectional communication) with the device to be charged (e.g., a terminal) during the connection of the second adapter 10 to the device to be charged (e.g., a terminal) to control the charging process of the second charging mode. The control unit may be a control unit in any of the implementations described above, such as a control unit in a first adjustment unit, or a control unit in a second adjustment unit.

The first charging mode may be a normal charging mode, while the second charging mode may be a quick charging mode. By the normal charging mode, it means that the second adapter outputs a relatively small current value (often below 2.5 A) or charges the battery of the device to be charged (e.g., a terminal) with a relatively small power (often less than 15 W). Thus, to fully charge a relatively large capacity battery, such as a battery having a capacity of 3000 mAh, under the normal charging mode, it may take a few hours. By contrast, in the quick charging mode, the second adapter can output a comparatively large current (often larger than 2.5 A, e.g., 4.5 A, 5 A, or even higher) or charges the battery of the device to be charged (e.g., a terminal) with a relatively large power (often greater than or equal to 15 W). Therefore, compared with the normal charging mode, the time required for the second adapter to fully charge a battery of the same capacity under the quick charging mode can be significantly shortened, resulting in a faster charging speed.

In the implementations of the present disclosure, communication contents communicated between the control unit of the second adapter and the device to be charged (e.g., a terminal), as well as a control mode by which the control unit controls the second adapter to output in the second charging mode, will not be limited. For example, the control unit may communicate with the device to be charged (e.g., a terminal) to interchange the present voltage or the present power of the battery of the device to be charged (e.g., a terminal), and further adjust the output voltage or output current of the second adapter based on the present voltage or the current power of the battery. Hereinafter the communication contents between the control unit and the device to be charged (e.g., a terminal) together with the control mode by which the control unit controls the second adapter to output in the second charging mode will be described in detail in connection with implementations.

In some implementations, the control unit may perform two-way communication with the device to be charged (e.g., a terminal) to control the second adapter to output in the second charging mode. In detail, the control unit may perform two-way communication with the device to be charged (e.g., a terminal) to negotiate a charging mode therebetween.

In some implementations, the second adapter will not indiscriminately use the second charging mode to quickly charge the device to be charged (e.g., a terminal) but instead will perform two-way communication with the device to be charged (e.g., a terminal) to negotiate whether the second adapter is approved to use the second charging mode to quick charge the device to be charged (e.g., a terminal) so as to improve the safety of the charging process.

In one implementation, the control unit may perform two-way communication with the device to be charged (e.g., a terminal) to negotiate the charging mode between the second adapter and the device to be charged in the following manners. The control unit may send a first instruction to the device to be charged (e.g., a terminal). The first instruction can be configured to inquire the device to be charged (e.g., a terminal) whether to enable the second charging mode. The control unit may then receive from the device to be charged (e.g., a terminal) a reply instruction responsive to the first instruction. The reply instruction responsive to the first instruction is configured to indicate whether the device to be charged (e.g., a terminal) agrees to enable the second charging mode. If the device to be charged (e.g., a terminal) agrees to enable the second charging mode, the control unit would use the second charging mode to charge the device to be charged, e.g., a terminal.

The above description, however, will not limit the master-slave relations between the second adapter (or the control unit of the second adapter) and the device to be charged, e.g., a terminal. In other words, either the control unit or the device to be charged (e.g., a terminal) may act as the master device to initiate a two-way communication session, and accordingly the other side may act as the slave device to make a first response or first reply to the communication initiated by the master device. As a possible implementation, during the communication process their roles of master device and slave device may be determined by comparing the electrical levels at the second adapter side and at the device to be charged (e.g., a terminal) side respectively relative to the earth.

In the implementations of the present disclosure, the implementation of the two-way communication between the second adapter (or the control unit of the second adapter) and the device to be charged (e.g., a terminal) is not limited. That is, either of the second adapter (or the control unit of the second adapter) and the device to be charged (e.g., a terminal) may act as the master device to initiate a communication session, and accordingly the other side may act as the slave device to make a first response or first reply to the communication session initiated by the master device. In addition, the master device may make a second response to the first response or first reply from the slave device, and hitherto one cycle of charging mode negotiation process between the master device and the slave device would be regarded to complete. In a possible implementation, the master device and slave device may perform multiple cycles of charging mode negotiations before executing the charging operation therebetween, so as to ensure that the charging process subsequent to the negotiation could be safely and reliably carried out.

An example in which the master device makes the second response to the slave device's first response or first reply with respect to the communication session may as follows. That is, the master device may receive from the slave device its first response or first reply to the communication session, and accordingly make a targeted second response to the first response or first reply. By way of example, when the master device receives within a predetermined length of time from the slave device its first response or first reply with respect to the communication session, the master device may make the second response targeted at the first response or first reply from the slave device as follows. That is, the master device and the slave device may perform one cycle of charging mode negotiation before they execute the charging operation in accordance with the first charging mode or the second charging mode according to a result of the negotiation, namely the second adapter may operate in the first charging mode or the second charging mode according to the negotiation result to charge the device to be charged, e.g., a terminal.

Another example in which the master device makes the further second response to the slave device's first response or first reply with respect to the communication session may as follows. That is, the master device may not receive the slave device's first response or first reply to the communication session within a predetermined length of time, but the master device may still make a targeted second response to the first response or first reply from the slave device. For example, when the master device does not receive the slave device's first response or first reply to the communication session within the predetermined length of time, the master device may still make the second response targeted at the first response or first reply received from the slave device as follows. That is, the master device and the slave device may perform one cycle of charging mode negotiation before they execute the charging operation in accordance with the first charging mode, namely the second adapter may operate in the first charging mode to charge the device to be charged, e.g., a terminal.

In some implementations, optionally, when the device to be charged (e.g., a terminal) initiates a communication session acting as the master device and the second adapter (or the control unit of the second adapter) acts as the slave device to offer a first response or first reply to the communication session initiated by the master device, the second adapter (or the control unit of the second adapter) and the device to be charged (e.g., a terminal) may be considered to have completed one cycle of charging mode negotiation without the device to be charged (e.g., a terminal) making the targeted second response to the first response or first reply from the second adapter. Consequently, the second adapter would determine to charge the device to be charged (e.g., a terminal) using the first charging mode or the second charging mode according to the negotiation result.

In some implementations, optionally, the control unit may perform two-way communication with the device to be charged (e.g., a terminal) to control the second adapter to output in the second charging mode in the following manners. The control unit may perform two-way communication with the device to be charged (e.g., a terminal) to determine the output charging voltage of the second adapter in the second charging mode that is used to charge the device to be charged (e.g., a terminal). The control unit may adjust the output voltage of the second adapter to be equal to the output charging voltage of the second adapter in the second charging mode that is used to charge the device to be charged (e.g., a terminal).

As one implementation, the control unit may perform two-way communication with the device to be charged (e.g., a terminal) to determine the charging voltage that is output from the second adapter and is used to charge the device to be charged in the second charging mode can be as follows. The control unit may send to the device to be charged (e.g., a terminal) a second instruction inquiring whether the output voltage of the second adapter matches the present voltage of the battery of the device to be charged (e.g., a terminal). The control unit may receive from the device to be charged (e.g., a terminal) a reply instruction responsive to the second instruction, that may be configured to indicate whether the output voltage of the second adapter is matching, higher, or lower with respect to the present voltage of the battery. Alternatively, the second instruction may be configured to inquire whether the present output voltage of the second adapter is suitable as the output charging voltage of the second adapter for charging the device to be charged (e.g., a terminal) in the second charging mode, while the reply instruction responsive to the second instruction may be configured to indicate whether the present output voltage of the second adapter is matching, high, or low. That the present output voltage of the second adapter matches the present voltage of the battery or is suitable as the second adapter's output charging voltage in the second charging mode for charging the device to be charged (e.g., a terminal) can mean that the present output voltage of the second adapter is slighter higher than the present voltage of the battery and the difference between the output voltage of the second adapter and the present voltage of the battery is within a predetermined range, usually on the order of several hundred millivolts.

In some implementations, the control unit may perform two-way communication with the device to be charged (e.g., a terminal) to control the charging process of the second adapter in the second charging mode in the following manners. The control unit may perform two-way communication with the device to be charged (e.g., a terminal) to determine the charging current that is output by the second adapter in the second charging mode and is used to charge the device to be charged (e.g., a terminal). The control unit may adjust the peak value of the current of the first pulsating waveform to be equal to the charging current that is output by the second adapter in the second charging mode and is used to charge the device to be charged (e.g., a terminal).

In one implementation, the control unit performs two-way communication with the device to be charged (e.g., a terminal) to determine the charging current that is output from the second adapter and is used to charge the device to be charged in the second charging mode can be as follows. The control unit may send a third instruction to the device to be charged (e.g., a terminal) to inquire about the maximum charging current that is currently supported by the device to be charged (e.g., a terminal). The control unit may receive from the device to be charged (e.g., a terminal) a reply instruction responsive to the third instruction; the reply instruction responsive to the third instruction is configured to indicate the maximum charging current currently supported by the device to be charged (e.g., a terminal). The control unit may then determine the charging current that is output by the second adapter in the second charging mode and is used to charge the device to be charged (e.g., a terminal) based on the maximum charging current currently supported by the device to be charged (e.g., a terminal). It will be appreciated that the control unit may determine the charging current that is output by the second adapter in the second charging mode and is used to charge the device to be charged (e.g., a terminal) based on the currently supported maximum charging current of the device to be charged (e.g., a terminal) in various manners. For example, the second adapter may determine the currently supported maximum charging current of the device to be charged (e.g., a terminal) as the second adapter's output charging current in the second charging mode that is used to charge the device to be charged (e.g., a terminal) or otherwise may take into consideration factors including the maximum charging current currently supported by the device to be charged (e.g., a terminal) and the electric current output capability of the second adapter per se before determining its output charging current in the second charging mode that is used to charge the device to be charged (e.g., a terminal).

In some implementations, the control unit may perform two-way communication with the device to be charged (e.g., a terminal) to control the second adapter to output in the second charging mode in the following manner. That is, when the second adapter charges the device to be charged (e.g., a terminal) using the second charging mode, the control unit may perform two-way communication with the device to be charged (e.g., a terminal) to adjust the peak value of the current of the first pulsating waveform.

As one implementation, the process that the control unit performs two-way communication with the device to be charged (e.g., terminal) to adjust the peak value of the current of the first pulsating waveform may include the following operations. The control unit may send a fourth instruction to the device to be charged (e.g., a terminal) to inquire about the present voltage of the battery of the device to be charged (e.g., a terminal). The control unit may receive from the second adapter a reply instruction responsive to the fourth instruction; the reply instruction responsive to the fourth instruction may be configured to indicate the present voltage of the battery. Accordingly, the control unit may adjust the peak value of the current of the first pulsating waveform based on the present voltage of the battery.

Figure 19A:
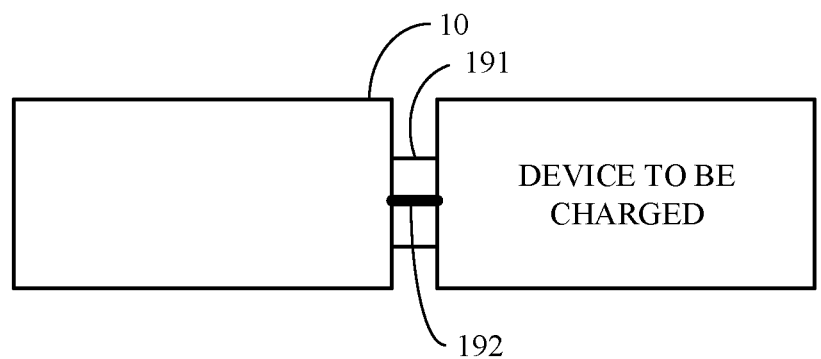
FIG. 19A illustrates the connection between a second adapter and a device to be charged according to an implementation.

In some implementations, the second adapter 10 may include a charging interface 191, as illustrated in FIG. 19A. Further, in some implementations, the control unit (e.g., the MCU illustrated in FIG. 21) in the second adapter 10 may perform two-way communication with the device to be charged (e.g., a terminal) via a data line 192 disposed in the charging interface 191.

In some implementations, optionally, the control unit may perform two-way communication with the device to be charged (e.g., a terminal) to control the second adapter to output in the second charging mode in the following manner. That is, the control unit may perform two-way communication with the device to be charged (e.g., a terminal) to determine whether the charging interface is in a poor contact.

As one implementation, the control unit may perform two-way communication with the device to be charged (e.g., a terminal) to determine whether the charging interface is in a poor contact in the following manners. The control unit may send a fourth instruction to the device to be charged (e.g., a terminal) to inquire about the present voltage of the battery of the device to be charged, e.g., a terminal. The control unit may receive from the device to be charged (e.g., a terminal) a reply instruction responsive to the fourth instruction; the reply instruction responsive to the fourth instruction is configured to indicate the present voltage of the battery of the device to be charged (e.g., a terminal). Accordingly, the control unit may determine whether the charging interface is in a poor contact based on the output voltage of the second adapter and the present voltage of the battery of the device to be charged (e.g., a terminal). For example, the control unit may determine that the difference between the output voltage of the second adapter and the present voltage of the device to be charged (e.g., a terminal) is greater than a predetermined voltage threshold, which may indicate that at this point the impedance obtained by dividing the voltage difference by the current output current value of the second adapter is larger than a predetermined impedance threshold, and therefore the charging interface will be determined as in a poor contact.

In some implementations, whether the charging interface is in a poor contact may alternatively be determined by the device to be charged (e.g., a terminal). In particular, the device to be charged (e.g., a terminal) may send a sixth instruction to the control unit to inquire about the output voltage of the second adapter. The device to be charged (e.g., a terminal) may receive from the control unit, a reply instruction responsive to the sixth instruction; the reply instruction responsive to the sixth instruction is configured to indicate the output voltage of the second adapter. Accordingly, the device to be charged (e.g., a terminal) may determine whether the charging interface is in a poor contact based on its current battery voltage in combination with the output voltage of the second adapter. After it determines that the charging interface is in a poor contact, the device to be charged (e.g., a terminal) may send a fifth instruction to the control unit to indicate that the charging interface is in a poor contact. The control unit may accordingly control the second adapter to quit the second charging mode after receiving the fifth instruction.

Figure 19B:
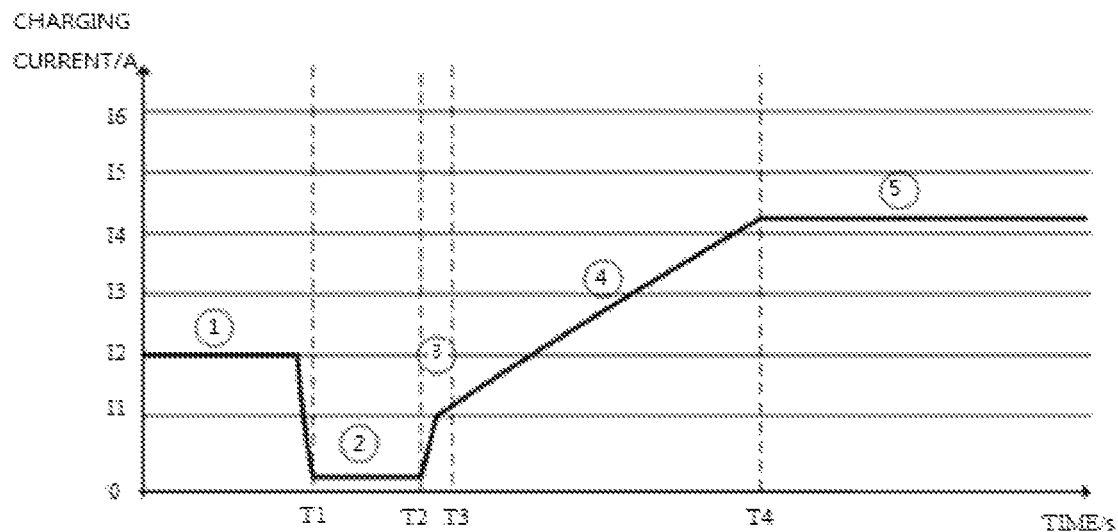
FIG. 19B illustrates a quick charging communication process according to an implementation.

Hereinafter, the communication process between the control unit of the second adapter and the device to be charged (e.g., a terminal) will be described in further detail with reference to FIG. 19B. It, however, should be noted that the example of FIG. 19B is merely intended for the purpose of assisting a person of skill in the art in understanding the implementations herein, rather than limiting the implementations to the specific numerical values or scenarios described. It will be evident to those of skill in the art that various modifications or variations can be made based on the example illustrated in FIG. 19B, and all such modifications or variations shall all fall in the scope of the implementations.

Referring now to FIG. 19B, the charging process of the device to be charged (e.g., a terminal) via the output of the second adapter in the second charging mode, may include five stages as follows.

Stage 1

After it is connected to a power supply device, the device to be charged (e.g., a terminal) may detect the type of the power supply device through data lines D+ and D−, and when the power supply device is detected as a second adapter, the device to be charged (e.g., a terminal) may receive a current larger than a predetermined current threshold I2, e.g., 1 A. When the control unit of the second adapter detects that the output current of the second adapter is greater than or equal to I2 for a predetermined duration of time, e.g., a continuous period of time T1, the control unit may assume that the device to be charged (e.g., a terminal) has finished the type identification of the power supply device. Thus, the control unit may start a negotiation procedure between the second adapter and the device to be charged (e.g., a terminal) and send Instruction 1 (corresponding to the above first instruction) to the device to be charged (e.g., a terminal) to inquire of the device to be charged (e.g., a terminal) whether it agrees to be charged by the second adapter in the second charging mode.

When the control unit receives from the device to be charged (e.g., a terminal) a reply instruction responsive to Instruction 1, and the reply instruction responsive to Instruction 1 indicates that the device to be charged (e.g., a terminal) does not agree to be charged by the second adapter in the second charging mode, then the control unit may redetect the output current of the second adapter. When the output current of the second adapter is still greater than or equal to I2 in a predetermined continuous duration of time, e.g., the continuous period of time T1, the control unit may again send another Instruction 1 to the device to be charged (e.g., a terminal) to inquire whether it agrees to be charged by the second adapter in the second charging mode. The control unit may repeatedly perform the above operations of stage 1 until the device to be charged (e.g., a terminal) agrees to be charged by the second adapter using the second charging mode, or until the output current of the second adapter no longer satisfies the condition of being greater than or equal to I2.

When the device to be charged (e.g., a terminal) agrees to be charged by the second adapter using the second charging mode, the communication process may proceed to a second stage.

Stage 2

The output voltage of the second adapter may include multiple levels. The control unit may send Instruction 2 (corresponding to the above second instruction) to the device to be charged (e.g., a terminal) to inquire whether the output voltage, i.e., the current output voltage, of the second adapter matches the present voltage of the battery of the device to be charged, e.g., a terminal.

The device to be charged (e.g., a terminal) may send a reply instruction responsive to Instruction 2 to the control unit to indicate that the output voltage of the second adapter matches the present voltage of the battery of the device to be charged, or is higher or lower than the present voltage of the battery of the device to be charged, e.g., a terminal. If the reply instruction responsive to Instruction 2 indicates the output voltage of the second adapter is high or low, the control unit may adjust the output voltage of the second adapter by one level, and then resend Instruction 2 to the device to be charged (e.g., a terminal) to re-inquire whether the output voltage of the second adapter matches the present voltage of the battery of the device to be charged, e.g., a terminal. The above operations of stage 2 will be repeatedly performed until the device to be charged (e.g., a terminal) replies that the output voltage of the second adapter matches the present voltage of the battery of the device to be charged (e.g., a terminal) and the communication process will then proceed to a third stage.

Stage 3

The control unit may send Instruction 3 (corresponding to the above third instruction) to the device to be charged (e.g., a terminal) to inquire about the maximum charging current that is currently supported by the device to be charged, e.g., a terminal. The device to be charged (e.g., a terminal) may send a reply instruction responsive to Instruction 3 to the control unit to indicate the currently supported maximum charging current of the device to be charged, e.g., a terminal. The communication process will then proceed to a fourth stage.

Stage 4

The control unit may determine the charging current that is output from the second adapter in the second charging mode and is used to charge the device to be charged (e.g., a terminal) based on the currently supported maximum charging current of the device to be charged, e.g., a terminal. The communication process will then continue to a fifth stage, i.e., the constant-current charging stage.

Stage 5

After entering the constant-current charging stage, the second adapter may send Instruction 4 (corresponding to the above fourth instruction) to the device to be charged (e.g., a terminal) at regular intervals, to inquire about the present voltage of the battery of the device to be charged, e.g., a terminal. The device to be charged (e.g., a terminal) may send a reply instruction responsive to Instruction 4 to the control unit to feed back the present voltage of the battery of the device to be charged, e.g., a terminal. The control unit may determine whether the charging interface is in a good contact and whether the peak value of the current of the first pulsating waveform needs to be reduced, based on the present voltage of the battery of the device to be charged, e.g., a terminal. When it determines that the charging interface is in a poor contact, the second adapter may send Instruction 5 (corresponding to the above fifth instruction) to the device to be charged (e.g., a terminal) and may quit the second charging mode and then reset to re-enter stage 1.

In some implementations, the reply instruction responsive to Instruction 1 sent by the device to be charged (e.g., a terminal) in stage 1 may carry the path impedance data or information of the device to be charged, e.g., a terminal. The path impedance data may be used to help determine in stage 5 whether the charging interface is in a good contact.

In some implementations, in stage 2, the time it takes from the point when the device to be charged (e.g., a terminal) agrees to be charged by the second adapter in the second charging mode to the point when the control unit adjusts the output voltage of the second adapter to the suitable charging voltage can be controlled within a certain range. If the time exceeds a predetermined range, the second adapter or the device to be charged (e.g., a terminal) may determine that the quick charging communication process is abnormal, and then may reset to re-enter stage 1.

In some implementations, when in stage 2 the output voltage of the second adapter is higher than the present voltage of the battery of the device to be charged (e.g., a terminal) by $\Delta V$, which can be set to the range of 200-500 mV, the device to be charged (e.g., a terminal) may send a reply instruction responsive to Instruction 2 to the control unit to indicate that the output voltage of the second adapter matches the battery voltage of the device to be charged, e.g., a terminal.

In some implementations, optionally, in stage 4 the adjustment speed of the output current of the second adapter may be controlled within a certain range, so as to avoid an excessive adjustment speed from causing abnormal in the charging process of the device to be charged (e.g., a terminal) through the output of the second adapter in the second charging mode.

In some implementations, the variation of the output current of the second adapter in stage 5 may be controlled within a degree of 5%.

In some implementations, in stage 5, the control unit can monitor the path impedance of a charging circuit in real time. As one implementation, the control unit may monitor the path impedance of the charging circuit based on the output voltage and output current of the second adapter, as well as the present voltage of the battery fed back from the device to be charged, e.g., a terminal. When the "path impedance of the charging circuit" is larger than the sum of "the path impedance of the device to be charged (e.g., a terminal)" and "the path impedance of the charging cable", the charging interface may be determined as in a poor contact, such that the second adapter may stop charging the device to be charged (e.g., a terminal) in the second charging mode.

In some implementations, after the second adapter enables the second charging mode to charge the device to be charged (e.g., a terminal), the communication time intervals between the control unit and the device to be charged (e.g., a terminal) can be controlled within a certain range, avoiding an exceedingly narrow communication interval from causing the communication process abnormal.

In some implementations, the termination of the charging process, or to be more specific, the termination of the charging process of the device to be charged (e.g., a terminal) by the second adapter in the second charging mode, may be divided into a recoverable termination and an unrecoverable termination.

For example, when the battery of the device to be charged (e.g., a terminal) is detected as being fully charged or the charging interface is detected as in a poor contact, the charging process may be terminated and the charging communication process may be reset such that the charging process may re-enter stage 1. Then the device to be charged (e.g., a terminal) would not agree to be charged by the second adapter using the second charging mode, and therefore, the communication process will not proceed to stage 2. The termination of the charging process, in this case, is regarded as an unrecoverable termination.

In another example, when a communication abnormality occurs between the control unit and the device to be charged (e.g., a terminal), the charging process may be terminated, and the charging communication process may be reset such that the charging process may re-enter stage 1. After the requirements of stage 1 are satisfied, the device to be charged (e.g., a terminal) may agree to be charged by the second adapter in the second charging mode such that the charging process is restored. The termination of the charging process, in this case, may be regarded as a recoverable termination.

In yet another example, when the device to be charged (e.g., a terminal) detects that the battery is malfunctioning, the charging process may be terminated, and the charging communication process would be reset such that the charging process may re-enter stage 1. Then the device to be charged (e.g., a terminal) may not agree to be charged by the second adapter using the second charging mode. When the battery returns to normal and the requirements of stage 1 are satisfied, the device to be charged (e.g., a terminal) may then agree to be charged by the second adapter with the second charging mode. The termination of the quick charging process, in this case, may be regarded as a recoverable termination.

The above-described communication actions or operations illustrated in FIG. 19B are merely examples. For example, in stage 1, after the device to be charged (e.g., a terminal) is connected to the second adapter, the handshaking communication between the device to be charged (e.g., a terminal) and the control unit can also be initiated by the device to be charged (e.g., a terminal), namely the device to be charged (e.g., a terminal) may send Instruction 1 to inquire the control unit whether to enable the second charging mode. When the device to be charged (e.g., a terminal) receives a reply instruction from the control unit indicating that the control unit approves of the second adapter charging the device to be charged (e.g., a terminal) in the second charging mode, the second adapter may begin to charge the battery of the device to be charged (e.g., a terminal) in the second charging mode.

As another example, a constant-voltage charging stage may further be included subsequent to stage 5. In detail, in stage 5, the device to be charged (e.g., a terminal) may feed back to the control unit its current battery voltage. When the present voltage of the battery reaches the constant-voltage charging voltage threshold, the charging process would turn from the constant-current charging stage to the constant-voltage charging stage. In the constant-voltage charging stage, the charging current may gradually decrease and the charging process (e.g., the entire charging process) would be terminated when the charging current drops to a certain threshold, indicating that the battery of the device to be charged (e.g., a terminal) has been fully charged.

Figure 20:
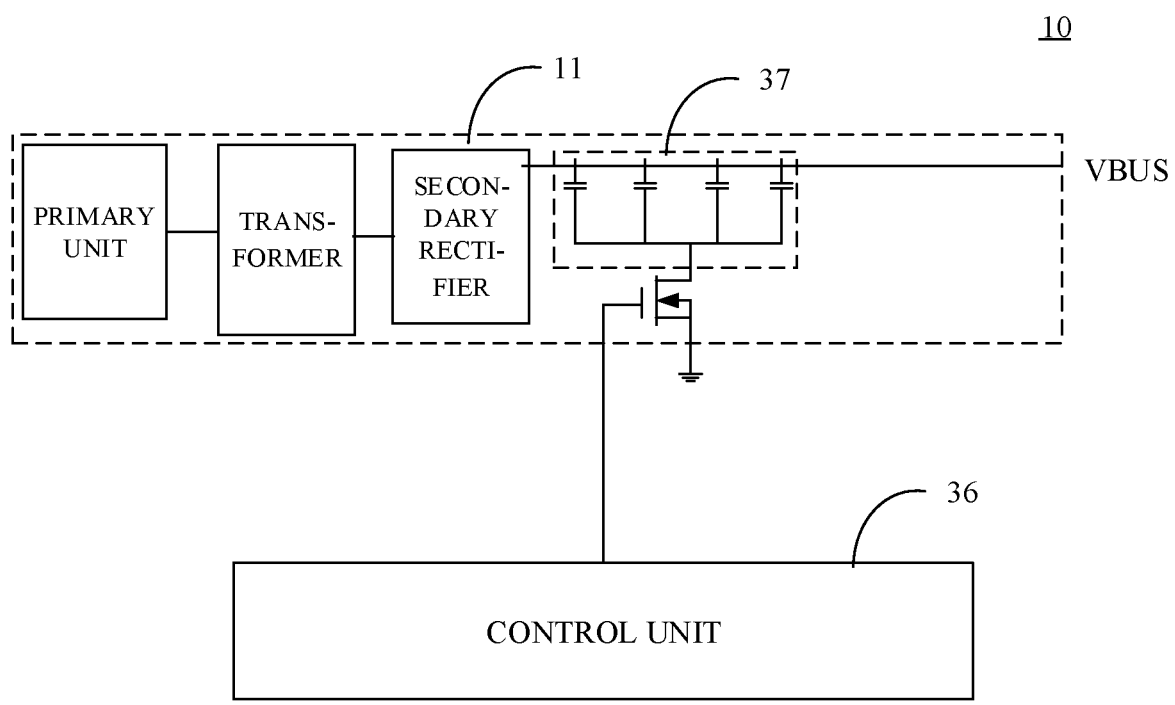
FIG. 20 is a schematic structure diagram of a second adapter according to another implementation.

Furthermore, on basis of any of the above implementations, the second adapter 10 is operable in a first charging mode and a second charging mode, as illustrated in FIG. 20, where the speed of the second adapter charging the device to be charged (e.g., a terminal) in the second charging mode may be faster than that in the first charging mode. The power converting unit 11 may include a secondary filter unit 37 while the second adapter 10 may include a control unit 36 that is coupled to the secondary filter unit 37. In the first charging mode, the control unit 36 may control the secondary filter unit 37 to operate to make the voltage value of the output voltage of second adapter 10 stable. In the second charging mode, the control unit 36 may control the secondary filter unit 37 to stop operating such that the output current of the second adapter 10 would become a current of the first pulsating waveform.

In the implementations, the control unit can control the secondary filter unit to operate or not operate such that the second adapter can output a common DC having a constant current value or a pulsating DC having a varying current value, thereby accommodating the conventional charging mode.

In some implementations, the second adapter can directly apply the current of the first pulsating waveform to both ends of the battery of the device to be charged (e.g., a terminal) so as to direct-charge the battery.

The term "direct-charge" may refer to directly applying the output voltage and output current of the second adapter to both ends of the device to be charged (e.g., a terminal) to charge the battery of the device to be charged (e.g., a terminal) without the need of intermediate conversion circuit to convert the output voltage and output current of the second adapter, thus avoiding energy loss caused by the conversion process. In order to be able to adjust the charging voltage or charging current on the charging circuit during the charging process in the second charging mode, the second adapter can be designed as an intelligent adapter to accomplish the conversion of the charging voltage or charging current, so as to reduce the burden on the device to be charged (e.g., a terminal) and to reduce the amount of heat produced by the device to be charged (e.g., a terminal).

The second adapter 10 is operable in the constant-current mode. The constant-current mode herein refers to a charging mode that controls the output current of the second adapter, and should not be interpreted as requiring the output current of the second adapter remain constant. In practice, the second adapter normally may adopt a multi-stage constant-current manner for charging under the constant-current mode.

The multi-stage constant-current charging may include a number of N charging stages, where N is an integer not smaller than two. The multi-stage constant-current charging may begin with a first stage using a predetermined charging current. Of the N charging stages of the multi-stage constant-current charging, the first stage through the $N^{th}$ stage may be sequentially performed, where when the charging turns from a previous charging stage to a next charging stage, the charging current value may become smaller, and, in addition, when the battery voltage reaches a corresponding charging cut-off voltage threshold, the charging may proceed from the previous charging stage to the next charging stage.

Further, in the case where the output current of the second adapter is a pulsating DC, the constant-current mode may refer to a charging mode in which the peak or mean value of the pulsating DC is controlled, namely the peak value of the output current of the second adapter may be controlled to not exceed the corresponding current of the constant-current mode.

Figure 22:
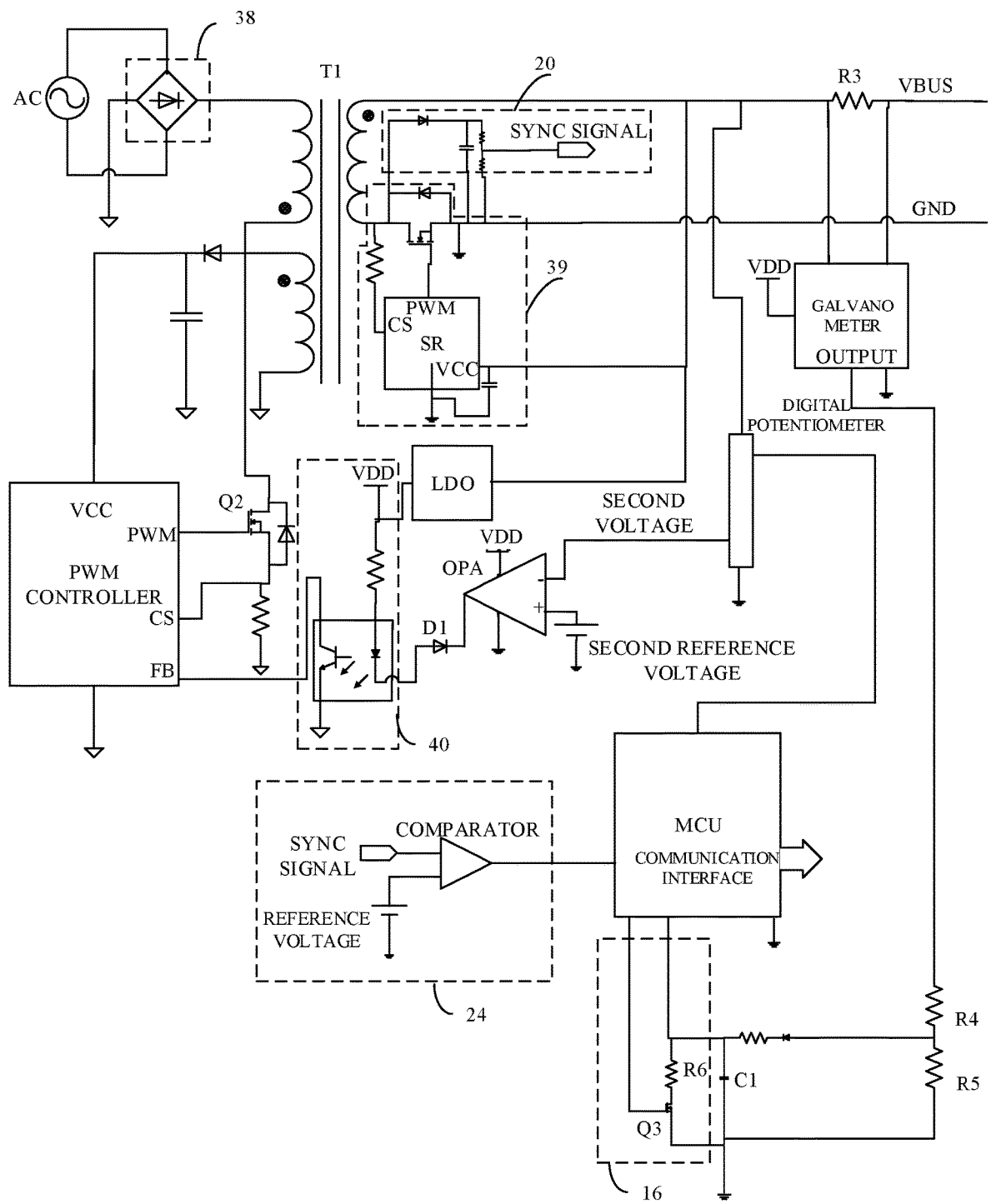
FIG. 22 is a schematic diagram illustrating a circuit structure of a second adapter according to another implementation.

Hereinafter, implementations of the disclosure will be described in more detail with examples. However, it should be noted that the examples of FIG. 21-FIG. 22 are merely intended for the purpose of assisting a person skilled in the art in understanding the implementations herein, rather than limiting the implementations to specific numerical values or scenarios described. It will be evident to those skilled in the art that various modifications or variations can be made based on the examples of FIG. 21-FIG. 22, without departing from the spirit and scope of the implementations.

The second adapter may include a power converting unit (corresponding to the above power converting unit 11). As illustrated in FIG. 21, the power converting unit may include an AC input end, a primary rectifying unit 38, a transformer T1, a secondary rectifying unit 39, and a first rectifying unit 20.

The AC input end may have mains current (typically an AC current of 220V) input and then transfer the mains current to the primary rectifying unit 38.

The primary rectifying unit 38 may be configured to convert the mains current to a current of the second pulsating waveform and transfer the second pulsating DC to the transformer T1. The primary rectifying unit 38 may be a bridge rectifying unit, e.g., a full-bridge rectifying unit as illustrated in FIG. 21, or a half-bridge rectifying unit, but the implementations are not limited thereto.

The transformer T1 may be configured to couple the first pulsating DC from the primary side to the secondary side of the transformer. The transformer T1 may be a normal transformer, or a high-frequency transformer having an operating frequency in the range of 50 KHz-2 MHz. The number and connection manner of primary windings of the transformer T1 are related to the type of a switching power supply used in the second adapter, but they will not be limited herein. For example, the second adapter may use a fly-back switching power supply, as illustrated in FIG. 21. The transformer's primary winding may include one end coupled to the primary rectifying unit 38 and another end coupled to a switch that is under control of a PWM controller. The second adapter may of course also use a forward switching power supply or a push-pull switching power supply. Different types of switching power supplies will have their respective connection manners between the primary rectifying unit and the transformer, which are not to be enumerated for simplicity purposes.

The secondary rectifying unit 39 is configured to rectify the current coupled to the secondary side from the primary side to obtain a current of the first pulsating waveform. The secondary rectifying unit 39 has a plurality of forms. FIG. 21 illustrates a typical secondary synchronous rectification circuit that includes a synchronous rectifier (SR) chip, a metal oxide semiconductor (MOS) transistor controlled by the SR chip, and a diode connected between the source and drain of the MOS transistor. The SR chip may transmit a PWM control signal to the gate of the MOS transistor to control the ON/OFF of the MOS transistor, thus achieving synchronous rectification at the secondary side.

The first rectifying unit 20 is configured to rectify the current coupled to the secondary side from the primary side to obtain a sync signal. As illustrated in FIG. 21, the first rectifying unit 20 may be a forward rectification circuit. The sync signal is a forward voltage output from the forward rectification circuit.

The second adapter may further include a sample and hold unit (corresponding to the sample and hold unit 12). The sample and hold unit includes a current sampling unit (corresponding to the current sampling unit 14) and a current holding unit (corresponding to the current holding unit 15).

As illustrated in FIG. 21, the current sampling unit includes a current sensing resistor R3 and a galvanometer. The galvanometer is configured to detect the current of the first pulsating waveform via the current sensing resistor R3 to obtain a sampling current and then convert the sampling current to a corresponding sampling voltage, which can indicate the magnitude of the current of the first pulsating waveform.

A circuit holding unit may include voltage division resistors R4, R5 and a capacitor C1. The circuit holding unit divides the sampling voltage output from the output port (OUTPUT) of the galvanometer via the voltage division resistors R4, R5 and then charges the capacitor C1 with the voltage obtained after voltage division, such that the voltage across the capacitor C1 varies as the current of the first pulsating waveform changes. When the first pulsating waveform reaches the peak or falling edge, the voltage across the capacitor C1 reaches its maximum (corresponding to the peak value of the current of the first pulsating waveform), and the sample and hold unit switches to the holding state.

The second adapter may further include a current acquisition and control unit (corresponding to the current acquisition and control unit 13). The current acquisition and control unit may further include an MCU (corresponding to the control unit), a comparing unit 24, and a discharging unit 16.

The comparing unit 24 may include a comparator. The comparator has a first input end for receiving the sync signal and a second input end for receiving the reference voltage. In some implementations, the first input end is an in-phase input end and the second input end is a reversed-phase input end. In other implementations, the first input end is the reversed-phase input end and the second input end is the in-phase input end. The comparator can transmit a comparison result to the MCU.

The MCU determines when the first pulsating waveform is at the peak or falling edge based on the comparison result of the comparator. It indicates that the sample and hold circuit is in the holding state when the first pulsating waveform is at the peak or falling edge. The MCU acquires the voltage across the capacitor C1 through the ADC to determine the peak value of the current of the first pulsating waveform.

The discharging unit 16 may include a switch transistor Q3 and a resistor R6. When the MCU acquires the peak value of the current of the first pulsating waveform, the MCU controls the switch transistor Q3 to switch on, and the capacitor C1 discharges the resistor R6 to release the charge across the capacitor C1. As such, the voltage across the capacitor C1 can be changed again following the change in the current of the first pulsating waveform, indicating that the sample and hold unit is switched from the holding state to the sampling state.

The second adapter may include a voltage adjusting unit (corresponding to the voltage adjusting unit 28 above). The voltage adjusting unit may include a voltage sampling unit (corresponding to the voltage sampling unit 29 above), a voltage comparing unit (corresponding to the voltage comparing unit 30), and a voltage control unit (corresponding to the voltage control unit 31 above).

As illustrated in FIG. 21, the voltage sampling unit includes a resistor R1 and a resistor R2 for dividing the output voltage of the second adapter to obtain a first voltage.

The voltage comparing unit includes an operational amplifier (OPA for short). The OPA has a reversed-phase input end for receiving the first voltage and an in-phase input end connected to the DAC to receive a first reference voltage provided by the DAC. The DAC is connected to the MCU. The MCU is configured to adjust the first reference voltage via the DAC so as to adjust the output voltage and/or output current of the second adapter.

The voltage control unit includes an optocoupler unit 40 and a PWM controller. The optocoupler unit 40 has an input end connected to an output end of the OPA. When the output voltage of the OPA is lower than the operating voltage VDD of the optocoupler unit 40, the optocoupler unit 40 may start to operate to supply a feedback voltage to an FB (feedback) end of the PWM controller. The PWM controller may accordingly control a duty ratio of a PWM signal output from the PWM end by comparing the voltages at the CS end and FB end. When the output voltage of the OPA equals "0", a stable voltage would be present at the FB end and so the PWM control signal output from the PWM end of the PWM controller would retain a certain duty ratio. The PWM end of the PWM controller may be coupled to the primary winding of the transformer T1 through the switch transistor Q2 to control the output voltage and output current of the second adapter. When the duty ratio of the control signal sent out from the PWM end keeps constant, the output voltage and output current of the second adapter will remain stable.

In addition, the MCU may also include a communication interface, through which the MCU can perform two-way communication with the device to be charged (e.g., a terminal) to control the charging process of the second adapter. In the case where the charging interface is a USB interface, the communication interface may also be a USB interface. In particular, the second adapter may use the power line in the USB interface to charge the device to be charged (e.g., a terminal) and use the data lines (D+ and/or D−) in the USB interface to communicate with the device to be charged, e.g., a terminal.

In addition, the optocoupler unit 40 may be coupled to a voltage regulating unit to stabilize the operating voltage of the optocoupler. As illustrated in FIG. 21, the voltage regulating unit in the implementations may be implemented as a low dropout regulator (LDO).

The implementation of FIG. 22 is similar to that of FIG. 21. The difference is that the voltage acquisition unit consisting of resistor R1 and resistor R2 in FIG. 21 is replaced by a digital potentiometer which corresponds to the above-mentioned voltage dividing unit 34. The reversed-phase input end of the OPA is coupled with a fixed second reference voltage. The MCU is configured to adjust the output voltage and output current of the second adapter by adjusting a voltage division ratio of the digital potentiometer. For example, if the output voltage of the second adapter is expected to be 5V, then the voltage division ratio of the digital potentiometer can be adjusted, such that the voltage at an output end of the digital potentiometer equals to the second reference voltage when the output voltage of the second adapter is 5V. Similarly, if the output voltage of the second adapter is expected to be 3V, then the voltage division ratio of the digital potentiometer can be adjusted, such that the voltage at the output end of the digital potentiometer equals to the second reference voltage when the output voltage of the second adapter is 3V.

In the implementations illustrated in FIG. 21-FIG. 22, the sync signal is obtained through rectification of the first rectifying unit 20; however, the implementation of the disclosure is not limited thereto. For example, the sync signal can be obtained from the primary side of the second adapter as illustrated in FIG. 9. Alternatively, the sync signal can be obtained from the sample and hold unit, such as from the output port (OUTPUT) of the galvanometer as illustrated in FIG. 21 and FIG. 22.

In the implementations illustrated in FIG. 21-FIG. 22, the comparing unit 24 compares the sync signal with the reference voltage directly to determine whether the sample and hold unit is in the holding state, however, the present disclosure is not limited thereto. For example, as illustrated in FIG. 13, DC signals in the sync signal can be filtered out via a capacitor to obtain the zero-crossing point AC signal, which is then compared with the reference voltage to determine whether the sample and hold unit is in the holding state.

In the figures, the control unit indicated with different reference numbers can be control units separated from each other or can be the same control unit. In some implementations, the second adapter includes an MCU, in which case the control unit mentioned herein refers to the MCU.

In combination with FIG. 1-FIG. 22, the device implementations of the disclosure have been described in detail.

In the following, method implementations will be described referring to FIG. 23. It should be noted that the description of the method corresponds to that of the device, and the repeated description is omitted in order to be concise.

Figure 23:
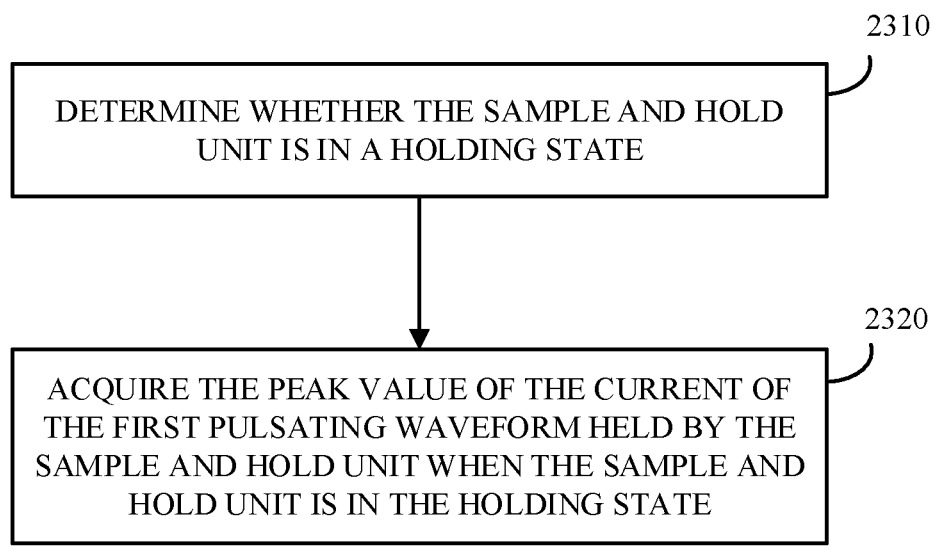
FIG. 23 is a flowchart illustrating a method for charging control according to an implementation.

FIG. 23 is a schematic flow diagram of the method for charging control provided herein, which is applicable to a second adapter such as the second adapter illustrated in FIG. 1-FIG. 22. The second adapter may include a power converting unit and a sample and hold unit. The power converting unit is configured to convert an input AC to obtain an output voltage and an output current of the second adapter. The output current of the second adapter is a current of a first pulsating waveform. The sample and hold unit is connected to the power converting unit. The sample and hold unit is configured to sample the current of the first pulsating waveform when the sample and hold unit is in the sampling unit, and hold the peak value of the current of the first pulsating waveform when the sample and hold unit is in the holding state.

As illustrated in FIG. 23, the method for charging control may include the following operations.

At block 2310, determine whether the sample and hold unit is in the holding state.

At block 2320, when the sample and hold unit is in the holding state, a peak value of the current of the first pulsating waveform held by the sample and hold unit is acquired.

As one implementation, whether the sample and hold unit is in the holding state can be determined as follows. A sync signal is received, the period of the sync signal is 1/N of the period of the first pulsating waveform, and N is an integer greater than or equal to one. Determine whether the sample and hold unit is in the holding state based on the sync signal.

As one implementation, the sync signal can be received as follows. For example, the sync signal is obtained from the power converting unit.

As one implementation, the power converting unit includes a primary unit and a secondary unit, and the sync signal can be obtained from the power converting unit as follows: the sync signal can be obtained from the secondary unit.

As one implementation, the secondary unit includes a first rectifying unit connected to the current acquisition and control unit. The first rectifying unit is configured to rectify the current coupled to the secondary unit from the primary unit to obtain a voltage of a second pulsating waveform, and transmit the voltage of the second pulsating waveform as a sync signal to the current acquisition and control unit.

As another implementation, the power converting unit includes a primary unit and a secondary unit, and the sync signal can be obtained from the primary unit.

As one implementation, the primary unit is configured to rectify the AC to obtain a voltage of a third pulsating waveform. The period of the third pulsating waveform is the same as that of the first pulsating waveform. The primary unit may couple the voltage of the third pulsating waveform from the primary side of the second adapter to the secondary side via an optocoupler unit to obtain a voltage of a fourth pulsating waveform, and transmit the voltage of the fourth pulsating waveform as a sync signal to the current acquisition and control unit.

As one implementation, the sync signal can be obtained from the sample and hold unit.

As one implementation, the sample and hold unit is configured to sample the current of the first pulsating waveform to obtain a sampling current, convert the sampling current to a sampling voltage, and transmit the sampling voltage as a sync signal to the current acquisition and control unit. The sampling voltage is configured to indicate the magnitude of the current of the first pulsating waveform.

As one implementation, whether the sample and hold unit is in the holding state can be determined based on the sync signal as follows. Whether the first pulsating waveform is at the peak or falling edge is determined based on the sync signal. The sample and hold unit is determined to be in the holding state when the first pulsating waveform is at the peak or falling edge.

As one implementation, whether the first pulsating waveform is at the peak or falling edge is determined based on the sync signal as follows. Whether the first pulsating waveform is at the peak or falling edge can be determined based on a comparison result between a voltage of the sync signal and the reference voltage.

As one implementation, whether the first pulsating waveform is at the peak or falling edge can be determined based on the sync signal as follows. DC signals in the sync signal is filtered out to obtain a zero-crossing point AC signal. The voltage of the AC signal is compared with the reference voltage. Whether the first pulsating waveform is at the peak or falling edge can be determined based on a comparison result between the voltage of the AC signal and the reference voltage, where the voltage value of the reference voltage is zero.

The period of the first pulsating waveform is the same as that of the sync signal.

The method of FIG. 23 may further include the follows. After acquiring the peak value of the current of the first pulsating waveform, the sample and hold unit is controlled to switch from the holding state to the sampling state.

As one implementation, the sample and hold unit may include a capacitor. The sample and hold unit is configured to hold the peak value of the current of the first pulsating waveform based on the capacitor. The sample and hold unit can be controlled to switch from the holding state to the sampling state as follows. The charge across the capacitor can be released, such that the sample and hold unit switches from the holding state to the sampling state.

As one implementation, the second adapter may further include a voltage adjusting unit. The voltage adjusting unit is connected to the power converting unit and configured to detect and adjust the output voltage of the second adapter. In this case, the method of FIG. 23 may further include the follows. The peak value of the current of the first pulsating waveform can be adjusted via the voltage adjusting unit.

As one implementation, the voltage adjusting unit may further include a voltage sampling unit, a voltage comparing unit, and a voltage control unit. The voltage sampling unit is connected to the power converting unit for sampling the output voltage of the second adapter to obtain a first voltage. The input end of the voltage comparing unit is connected to the voltage sampling unit, to compare the first voltage with the first reference voltage. The input end of the voltage control unit is connected to the output end of the voltage comparing unit. The output end of the voltage control unit is connected to the power converting unit. The voltage control unit controls the output voltage of the second adapter based on the comparison result of the first voltage and the first reference voltage. The peak value of the current of the first pulsating waveform can be adjusted through the voltage adjusting unit in the following manner. The peak value of the current of the first pulsating waveform can be adjusted by adjusting the voltage value of the first reference voltage.

The peak value of the current of the first pulsating waveform can be adjusted by adjusting the voltage value of the first reference voltage through a digital DAC.

As one implementation, the voltage adjusting unit may include a voltage dividing unit, a voltage comparing unit, and a voltage control unit. The input end of the voltage dividing unit is connected to the power converting unit, to divide the output voltage of the second adapter by a voltage division ratio to generate a second voltage. The input end of the voltage comparing unit is connected to the output end of the voltage dividing unit, to compare the second voltage with the second reference voltage. The input end of the voltage control unit is connected to the input end of the voltage comparing unit. The output end of the voltage control unit is connected to the power converting unit. The voltage control unit controls the output voltage of the second adapter based on the comparison result between the second voltage and the second reference voltage. In this case, the peak value of the current of the first pulsating waveform can be adjusted by adjusting the voltage division ratio.

As one implementation, the voltage dividing unit may include a digital potentiometer. The high potential side of the digital potentiometer is connected to the power converting unit. The low potential side of the digital potentiometer is grounded. The output end of the digital potentiometer is connected to the voltage comparing unit. In this case, the peak value of the current of the first pulsating waveform can be adjusted by adjusting the voltage division ratio of the digital potentiometer.

As one implementation, the sample and hold unit may include a current sampling unit and a current holding unit. The current sampling unit can be connected to the power converting unit to detect the current of the first pulsating waveform, so as to obtain a sampling current and convert it to a sampling voltage. The sampling voltage is configured to indicate the magnitude of the current of the first pulsating waveform. The current holding unit is connected to the current sampling unit and the current acquisition and control unit. The current holding unit may receive the sampling voltage from the current sampling unit and charge the capacitor in the current holding unit based on the sampling voltage. In this case, the peak value of the current of the first pulsating waveform can be obtained by acquiring the voltage across the capacitor of the sample and hold unit.

In one implementation, the peak value of the current of the first pulsating waveform can be acquired based on ADC.

As one implementation, the second adapter is operable in a first charging mode and a second charging mode. The charging speed of the device to be charged by the second adapter in the second charging mode is faster than in the first charging mode. The current of the first pulsating waveform is the output current of the second adapter in the second charging mode. Furthermore, when the second adapter is connected to the device to be charged, in the method of FIG. 23, the second adapter may perform two-way communication with the device to be charged to control the second adapter to output in the second charging mode.

As one implementation, performing two-way communication with the device to be charged to control the second adapter to output in the second charging mode may include performing two-way communication with the device to be charged to negotiate a charging mode between the second adapter and the device to be charged.

As one implementation, performing two-way communication with the device to be charged to negotiate the charging mode may include: sending a first instruction to the device to be charged to inquire the device to be charged whether to enable the second charging mode; receiving from the device to be charged a reply instruction responsive to the first instruction, where the reply instruction responsive to the first instruction indicates whether the device to be charged agrees to enable the second charging mode; using the second charging mode to charge the device to be charged when the device to be charged agrees to enable the second charging mode.

As one implementation, performing two-way communication with the device to be charged to control the second adapter to output in the second charging mode may include: performing two-way communication with the device to be charged to determine the charging voltage that is output from the second adapter in the second charging mode and is used to charge the device to be charged; adjusting the output voltage of the second adapter to be equal to the charging voltage that is output from the second adapter in the second charging mode and is used to charge the device to be charged.

As one implementation, performing two-way communication with the device to be charged to determine the charging voltage that is output from the second adapter in the second charging mode and is used to charge the device to be charged may include: sending a second instruction to the device to be charged to inquire whether the output voltage of the second adapter matches the present voltage of the battery of the device to be charged; receiving, from the device to be charged, a reply instruction responsive to the second instruction, and the reply instruction responsive to the second instruction indicates whether the output voltage of the second adapter matches the present voltage of the battery, or is higher, or lower than the present voltage of the battery.

As one implementation, performing two-way communication with the device to be charged to control the second adapter to output in the second charging mode may include: performing two-way communication with the device to be charged to determine the charging current that is output by the second adapter in the second charging mode and is used to charge the device to be charged; adjusting the peak value of the current of the first pulsating waveform to be equal to the charging current that is output by the second adapter in the second charging mode and is used to charge the device to be charged.

As one implementation, performing two-way communication with the device to be charged to determine the charging current that is output by the second adapter in the second charging mode and is used to charge the device to be charged may include: sending a third instruction to the device to be charged to inquire about the maximum charging current currently supported by the device to be charged; receiving, from the device to be charged, a reply instruction responsive to the third instruction, and the reply instruction responsive to the third instruction indicates the maximum charging current currently supported by the device to be charged; determining the charging current that is output by the second adapter in the second charging mode and is used to charge the device to be charged based on the maximum charging current of the device to be charged currently supports.

As one implementation, performing two-way communication with the device to be charged to control the second adapter to output in the second charging mode may include performing two-way communication with the device to be charged to adjust the peak value of the current of the first pulsating waveform during the charging process in the second charging mode.

As one implementation, performing two-way communication with the device to be charged to adjust the peak value of the current of the first pulsating waveform may include:

sending a fourth instruction to the device to be charged to inquire about the present voltage of the battery of the device to be charged; receiving a reply instruction responsive to the fourth instruction from the second adapter, that indicates the present voltage of the battery; adjusting the peak value of the current of the first pulsating waveform based on the present voltage of the battery.

As one implementation, the second adapter may include a charging interface. The second adapter may perform two-way communication with the device to be charged through a data line in the charging interface.

As one implementation, the second adapter is operable in a first charging mode which may be a constant-voltage mode and a second charging mode which may be a constant-current mode. The current of the first pulsating waveform is the output current of the second adapter in the second charging mode. The second adapter includes a control unit. The power converting unit includes a secondary filter unit. The control unit is connected to the secondary filter unit. The method of FIG. 23 may further include: controlling in the first charging mode the secondary filter unit to operate such that the output voltage of the second adapter keeps constant; controlling in the second charging mode the secondary filter unit to stop operating such that the output current of the second adapter would become the current of the first pulsating waveform.

As one implementation, the second adapter may apply the current of the first pulsating waveform directly to both ends of the battery of the device to be charged so as to direct-charge the battery.

As one implementation, the second adapter may be a second adapter configured to charge a mobile terminal.

As one implementation, the second adapter may include a control unit that controls the charging process. The control unit may be an MCU.

As one implementation, the second adapter may include a charging interface which may be a USB interface.

It will be appreciated that the use of terms "first adapter" and "second adapter" is for purposes of illustration only and not of limiting the type of the adapter of the implementations.

Those of ordinary skill in the art will appreciate that units (including sub-units) and algorithmic operations of various examples described in connection with implementations herein can be implemented by electronic hardware or by a combination of computer software and electronic hardware. Whether these functions are performed by means of hardware or software depends on the application and the design constraints of the associated technical solution. A professional technician may use different methods with regard to each particular application to implement the described functionality, but such methods should not be regarded as lying beyond the scope of the disclosure.

It will be evident to those skilled in the art that the corresponding processes of the above method implementations can be referred to for the working processes of the foregoing systems, apparatuses, and units, for purposes of convenience and simplicity.

It will be appreciated that the systems, apparatuses, and methods disclosed in implementations herein may also be implemented in various other manners. For example, the above apparatus implementations are merely illustrative, e.g., the division of units (including sub-units) is only a division of logical functions, and there may exist other ways of division in practice, e.g., multiple units (including sub-units) or components may be combined or may be integrated into another system, or some features may be ignored or not included. In other respects, the coupling or direct coupling or communication connection as illustrated or discussed may be an indirect coupling or communication connection through some interface, device or unit, and may be electrical, mechanical, or otherwise.

Separated units (including sub-units) as illustrated may or may not be physically separated. Components or parts displayed as units (including sub-units) may or may not be physical units, and may reside at one location or may be distributed to multiple networked units. Some or all of the units (including sub-units) may be selectively adopted according to practical needs to achieve desired objectives of the disclosure.

Additionally, various functional units (including sub-units) described in implementations herein may be integrated into one processing unit or may be present as a number of physically separated units, and two or more units may be integrated into one.

If the integrated units are implemented as software functional units and sold or used as standalone products, they may be stored in a computer-readable storage medium. Based on such an understanding, the essential technical solution, or the portion that contributes to the prior art, or all or part of the technical solution of the disclosure may be embodied as software products. Computer software products can be stored in a storage medium and may include multiple instructions that, when executed, can cause a computing device, e.g., a personal computer, a server, a second adapter, a network device, etc., to execute some or all operations of the methods as described in the various implementations. The above storage medium may include various kinds of media that can store program code, such as a USB flash disk, a mobile hard drive, a read-only memory (ROM), a random access memory (RAM), a magnetic disk, or an optical disk.

The foregoing description merely depicts some exemplary implementations of the disclosure and therefore is not intended as limiting the scope of the present disclosure. Any variations or substitutions that can be readily thought of by any persons skilled in the art based on the scope of the present disclosure shall all be covered within the protection of the present disclosure.

What is claimed is:

1. An adapter, comprising:
   a power converting unit, configured to convert an input alternating current (AC) to obtain an output voltage and an output current of the adapter, wherein the output current of the adapter is a current of a first pulsating waveform;
   a sample and hold unit, connected to the power converting unit, and configured to sample the current of the first pulsating waveform when the sample and hold unit is in a sampling state and hold a peak value of the current of the first pulsating waveform when the sample and hold unit is in a holding state; and
   a current acquisition and control unit, connected to the sample and hold unit and configured to determine whether the sample and hold unit is in the holding state and acquire the peak value of the current of the first pulsating waveform held by the sample and hold unit when the sample and hold unit is in the holding state, wherein the adapter is operable in a first charging mode and a second charging mode, and a charging speed of a device to be charged by the adapter in the second charging mode is faster than a charging speed of the device to be charged by the adapter in the first charging mode.

2. The adapter of claim 1, wherein the current acquisition and control unit is configured to receive a sync signal and determine, based on the sync signal, whether the sample and hold unit is in the holding state, wherein a period of the sync signal is 1/N of a period of the first pulsating waveform, and wherein N is an integer greater than or equal to one.

3. The adapter of claim 2, wherein the current acquisition and control unit is connected to the power converting unit and configured to obtain the sync signal from the power converting unit.

4. The adapter of claim 3, wherein the power converting unit comprises a primary unit and a secondary unit, the current acquisition and control unit is connected to the secondary unit and configured to obtain the sync signal from the secondary unit.

5. The adapter of claim 4, wherein the secondary unit comprises a first rectifying unit connected to the current acquisition and control unit, and wherein the first rectifying unit is configured to rectify a current which is coupled to the secondary unit by the primary unit to obtain a voltage of a second pulsating waveform and transmit the voltage of the second pulsating waveform as the sync signal to the current acquisition and control unit.

6. The adapter of claim 2, wherein the current acquisition and control unit is configured to:
determine, based on the sync signal, whether the first pulsating waveform is at a peak or a falling edge; and
acquire the peak value of the current of the first pulsating waveform held by the sample and hold unit when the first pulsating waveform is at the peak or the falling edge.

7. The adapter of claim 6, wherein the current acquisition and control unit comprises:
a comparator and a control unit, wherein the comparator comprises a first input end configured to receive the sync signal and a second input end configured to receive a reference voltage, and wherein the control unit is connected to an output end of the comparator and configured to determine, based on a comparison result between a voltage of the sync signal and the reference voltage, whether the first pulsating waveform is at the peak or the falling edge.

8. The adapter of claim 6, wherein the current acquisition and control unit comprises:
a comparing unit and a control unit, wherein the comparing unit comprises a capacitor and a comparator, and wherein
the capacitor is configured to receive the sync signal and filter a direct current (DC) signal contained in the sync signal to obtain a zero-crossing point AC signal,
the comparator comprises a first input end connected to the capacitor and configured to receive the zero-crossing point AC signal and a second input end configured to receive a reference voltage,
the comparator is configured to compare a voltage of the zero-crossing point AC signal with the reference voltage, and
the control unit is connected to an output end of the comparator and configured to determine, based on a comparison result between the voltage of the zero-crossing point AC signal and the reference voltage, whether the first pulsating waveform is at the peak or the falling edge, wherein a voltage value of the reference voltage is zero.

9. The adapter of claim 2, wherein the period of the first pulsating waveform is the same as the period of the sync signal.

10. The adapter of claim 1, wherein the current acquisition and control unit is further configured to control the sample and hold unit to switch from the holding state to the sampling state after acquiring the peak value of the current of the first pulsating waveform.

11. The adapter of claim 10, wherein the sample and hold unit comprises a capacitor and is configured to hold the peak value of the current of the first pulsating waveform based on the capacitor of the sample and hold unit; and
wherein the current acquisition and control unit comprises a discharging unit and a control unit, the discharging unit is connected to the control unit and the capacitor of the sample and hold unit, respectively, and configured to release charges across the capacitor of the sample and hold unit under control of the control unit, wherein the sample and hold unit switches from the holding state to the sampling state.

12. The adapter of claim 1, further comprising:
a voltage adjusting unit, connected to the power converting unit and configured to detect and adjust the output voltage of the adapter; and
wherein the current acquisition and control unit is connected to the voltage adjusting unit and configured to adjust the peak value of the current of the first pulsating waveform through the voltage adjusting unit.

13. The adapter of claim 1, wherein the sample and hold unit comprises:
a current sampling unit, connected to the power converting unit, and configured to detect the current of the first pulsating waveform to obtain a sampling current and convert the sampling current to a sampling voltage, wherein the sampling voltage is configured to indicate a magnitude of the current of the first pulsating waveform;
a current holding unit, connected to the current sampling unit and the current acquisition and control unit, and configured to receive the sampling voltage from the current sampling unit and charge a capacitor of the current holding unit based on the sampling voltage; and
wherein the current acquisition and control unit is configured to acquire the peak value of the current of the first pulsating waveform by detecting a voltage across the capacitor of the sample and hold unit.

14. The adapter of claim 1, wherein the current acquisition and control unit comprises an analog-to-digital converter (ADC), and the current acquisition and control unit is configured to acquire the peak value of the current of the first pulsating waveform based on the ADC.

15. The adapter of claim 1, wherein the current of the first pulsating waveform is the output current of the adapter in the second charging mode, and wherein the adapter comprises a control unit configured to perform two-way communication with the device to be charged to control an output of the adapter in the second charging mode, when the adapter is connected to the device to be charged.

16. The adapter of claim 15, wherein the control unit configured to perform the two-way communication with the device to be charged to control the output of the adapter in the second charging mode is further configured to:
perform the two-way communication with the device to be charged to negotiate a charging mode between the adapter and the device to be charged.

17. The adapter of claim 15, wherein the control unit configured to perform the two-way communication with the device to be charged to control the output of the adapter in the second charging mode is further configured to:

perform the two-way communication with the device to be charged to determine a charging voltage, wherein the charging voltage is outputted from the adapter in the second charging mode for charging the device to be charged; and the control unit is configured to adjust the output voltage of the adapter, wherein the output voltage of the adapter is equal to the charging voltage outputted from the adapter in the second charging mode for charging the device to be charged.

18. The adapter of claim 15, wherein the control unit configured to perform the two-way communication with the device to be charged to control the output of the adapter in the second charging mode is further configured to:

perform the two-way communication with the device to be charged to determine a charging current, wherein the charging current is output from the adapter in the second charging mode for charging the device to be charged; and adjust the peak value of the current of the first pulsating waveform, wherein the peak value of the current of the first pulsating waveform is equal to the charging current outputted from the adapter in the second charging mode for charging the device to be charged.

19. The adapter of claim 15, wherein the control unit configured to perform the two-way communication with the device to be charged to control the output of the adapter in the second charging mode is further configured to:

perform the two-way communication with the device to be charged to adjust the peak value of the current of the first pulsating waveform, when charging with the second charging mode.

20. A method for charging control, applicable to an adapter, comprising:

determining whether a sample and hold unit is in a holding state, wherein the adapter comprises a power converting unit and the sample and hold unit, the power converting unit is configured to convert an input alternating current (AC) to obtain an output voltage and an output current of the adapter, and the output current of the adapter is a current of a first pulsating waveform; and the sample and hold unit is connected to the power converting unit and configured to sample the current of the first pulsating waveform when the sample and hold unit is in a sampling state and hold a peak value of the current of the first pulsating waveform when the sample and hold unit is in the holding state; and acquiring the peak value of the current of the first pulsating waveform held by the sample and hold unit when the sample and hold unit is in the holding state, wherein the adapter is operable in a first charging mode and a second charging mode, and a charging speed of a device to be charged by the adapter in the second charging mode is faster than a charging speed of the device to be charged by the adapter in the first charging mode.

21. The method of claim 20, wherein determining whether the sample and hold unit is in the holding state comprises:

receiving a sync signal, wherein a period of the sync signal is 1/N of a period of the first pulsating waveform, and wherein N is an integer greater than or equal to one; and determining, based on the sync signal, whether the sample and hold unit is in the holding state.

22. The method of claim 21, wherein the power converting unit comprises a primary unit and a secondary unit, and obtaining the sync signal from the power converting unit comprises:

obtaining the sync signal from the secondary unit of the power converting unit.

23. The method of claim 21, wherein determining, based on the sync signal, whether the sample and hold unit is in the holding state comprises:

determining, based on the sync signal, whether the first pulsating waveform is at a peak or a falling edge; and determining that the sample and hold unit is in the holding state when the first pulsating waveform is at the peak or the falling edge.

24. The method of claim 23, wherein determining, based on the sync signal, whether the first pulsating waveform is at the peak or the falling edge comprises:

determining whether the first pulsating waveform is at the peak or the falling edge, based on a comparison result between a voltage of the sync signal and a reference voltage.

25. The method of claim 23, wherein determining, based on the sync signal, whether the first pulsating waveform is at the peak or the falling edge comprises:

filtering a direct current (DC) signal contained in the sync signal to obtain a zero-crossing point AC signal;

comparing a voltage of the zero-crossing point AC signal with a reference voltage; and determining whether the first pulsating waveform is at the peak or the falling edge, based on a comparison result between the voltage of the zero-crossing point AC signal and the reference voltage, wherein a voltage value of the reference voltage is zero.

* * * * *